United States Patent
O'Toole et al.

(10) Patent No.: US 10,503,065 B2
(45) Date of Patent: Dec. 10, 2019

(54) PHOTOLITHOGRAPHIC PATTERNING OF DEVICES

(71) Applicant: ORTHOGONAL, INC., Rochester, NY (US)

(72) Inventors: Terrence Robert O'Toole, Webster, NY (US); John Andrew DeFranco, Rochester, NY (US); Frank Xavier Byrne, Webster, NY (US)

(73) Assignee: Orthogonal, Inc., Rochester, NY (US)

(*) Notice: Subject to any disclaimer, the term of this patent is extended or adjusted under 35 U.S.C. 154(b) by 0 days.

(21) Appl. No.: 15/501,128

(22) PCT Filed: Jul. 31, 2015

(86) PCT No.: PCT/US2015/043036
§ 371 (c)(1),
(2) Date: Feb. 1, 2017

(87) PCT Pub. No.: WO2016/019212
PCT Pub. Date: Feb. 4, 2016

(65) Prior Publication Data
US 2017/0219921 A1 Aug. 3, 2017

Related U.S. Application Data

(60) Provisional application No. 62/031,897, filed on Aug. 1, 2014, provisional application No. 62/096,582, filed on Dec. 24, 2014.

(51) Int. Cl.
| | | |
|---|---|---|
| G03F 7/00 | (2006.01) |
| H01L 51/00 | (2006.01) |
| G03F 7/004 | (2006.01) |
| G03F 7/038 | (2006.01) |
| G03F 7/039 | (2006.01) |
| G03F 7/32 | (2006.01) |
| G03F 7/40 | (2006.01) |
| C11D 7/50 | (2006.01) |
| H01L 51/56 | (2006.01) |

(52) U.S. Cl.
CPC ............ G03F 7/0035 (2013.01); C11D 7/505 (2013.01); G03F 7/0002 (2013.01); G03F 7/0046 (2013.01); G03F 7/038 (2013.01); G03F 7/0392 (2013.01); G03F 7/0397 (2013.01); G03F 7/325 (2013.01); G03F 7/40 (2013.01); H01L 51/0016 (2013.01); H01L 51/0018 (2013.01); H01L 51/56 (2013.01)

(58) Field of Classification Search
CPC .................................................. G03F 7/0046
See application file for complete search history.

(56) References Cited

U.S. PATENT DOCUMENTS

| | | | |
|---|---|---|---|
| 4,720,432 A | 1/1988 | VanSlyke et al. |
| 5,776,623 A | 7/1998 | Hung et al. |
| 6,013,538 A | 1/2000 | Burrows et al. |
| 6,208,075 B1 | 3/2001 | Hung et al. |
| 6,720,573 B2 | 4/2004 | Son et al. |
| 7,684,868 B2 | 3/2010 | Tai et al. |
| 7,830,080 B2 | 11/2010 | Tanada |
| 7,955,719 B2 | 6/2011 | Hatwar et al. |
| 8,106,582 B2 | 1/2012 | Yamamichi et al. |
| 8,587,003 B2 | 11/2013 | Ando |
| 8,846,301 B2 | 9/2014 | Ober et al. |
| 9,034,736 B2 | 5/2015 | Sirringhaus et al. |
| 9,054,341 B2 | 6/2015 | Kim et al. |
| 9,091,913 B2 | 7/2015 | Katz et al. |
| 9,104,104 B2 | 8/2015 | Wright et al. |
| 9,298,088 B2 | 3/2016 | Robello et al. |
| 9,500,948 B2 | 11/2016 | Wright et al. |
| 9,541,829 B2 | 1/2017 | Robello et al. |
| 9,806,099 B2 | 10/2017 | Yamazaki et al. |
| 9,899,636 B2 | 2/2018 | DeFranco et al. |
| 9,941,309 B2 | 4/2018 | Yamazaki et al. |

(Continued)

FOREIGN PATENT DOCUMENTS

| | | |
|---|---|---|
| EP | 0 924 245 A2 | 6/1999 |
| EP | 2 784 839 A1 | 10/2014 |

(Continued)

OTHER PUBLICATIONS

International Search Report for corresponding International Patent Application No. PCT/US2015/043036 dated Nov. 6, 2015, 2 pgs.
Malinowski, P. et al., "True-Color 640 ppi OLED Arrays Patterned by CA i-line Photolithography", SID 2015 Digest, 215-218 (2015).
Yamamoto, H. et al., "Understanding Extrinsic Degradation in Phosphorescent OLEDs", SID 2014 Digest, 758-761 (2014).
Krotkus, S. et al., "Influence of bilayer processing on p-i-n OLEDs: towards multicolor photolithographic structuring of organic displays", Proc. of SPIE, 9360: 93600W-1-93600W-10 (2015).
Krotkus, S. et al., "Photo-patterning of Highly Efficient State-of-the-Art Phosphorescent OLEDs Using Orthogonal Hydrofluoroethers", Adv. Optical Mater., 2(11): 1043-1048 (2014).

(Continued)

*Primary Examiner* — Kathleen Duda
(74) *Attorney, Agent, or Firm* — Merchant & Gould P.C.

(57) ABSTRACT

A method of patterning a device is disclosed using a resist precursor structure having at least two fluoropolymer layers. A first fluoropolymer layer includes a first fluoropolymer material having a fluorine content of at least 50% by weight and is substantially soluble in a first hydrofluoroether solvent or in a first perfluorinated solvent, but substantially less soluble in a second hydrofluoroether solvent relative to both the first hydrofluoroether and the first perfluorinated solvent. The second fluoropolymer layer includes a second fluoropolymer material having a fluorine content less than that of the first fluoropolymer material and is substantially soluble in the first or second hydrofluoroether solvents, but substantially less soluble in the first perfluorinated solvent relative to both the first and second hydrofluoroether solvents.

30 Claims, 6 Drawing Sheets

(56) References Cited

U.S. PATENT DOCUMENTS

| | | |
|---|---|---|
| 2004/0211956 A1 | 10/2004 | Kanno et al. |
| 2005/0153058 A1 | 7/2005 | Tachikawa et al. |
| 2008/0124824 A1 | 5/2008 | Tsai et al. |
| 2010/0193778 A1 | 8/2010 | An et al. |
| 2010/0289019 A1 | 11/2010 | Katz et al. |
| 2011/0101317 A1 | 5/2011 | Gregory et al. |
| 2011/0159252 A1 | 6/2011 | Ober et al. |
| 2011/0309389 A1 | 12/2011 | Yu et al. |
| 2012/0252149 A1 | 10/2012 | Hiroki et al. |
| 2012/0305897 A1 | 12/2012 | Ober et al. |
| 2013/0075768 A1 | 3/2013 | Kim et al. |
| 2013/0084664 A1 | 4/2013 | Yoshitoku et al. |
| 2013/0126833 A1 | 5/2013 | Endo et al. |
| 2013/0137205 A1 | 5/2013 | Moriyama et al. |
| 2014/0127625 A1 | 5/2014 | Defranco et al. |
| 2014/0154827 A1 | 6/2014 | Lee et al. |
| 2014/0197378 A1 | 7/2014 | Lecloux et al. |
| 2014/0197379 A1 | 7/2014 | Li |
| 2014/0319499 A1 | 10/2014 | Yamazaki et al. |
| 2014/0322656 A1 | 10/2014 | Wright et al. |
| 2014/0356789 A1 | 12/2014 | Wright et al. |
| 2015/0000976 A1 | 1/2015 | Frohler et al. |
| 2015/0132699 A1 | 5/2015 | Robello et al. |
| 2015/0140729 A1* | 5/2015 | Ferro ............... G03F 7/2022 438/99 |
| 2016/0027763 A1 | 1/2016 | Cope |
| 2016/0049518 A1 | 2/2016 | Endo |
| 2016/0164040 A1 | 6/2016 | Kurata et al. |
| 2017/0236849 A1 | 8/2017 | Endo |

FOREIGN PATENT DOCUMENTS

| | | |
|---|---|---|
| WO | 02/04534 A2 | 1/2002 |
| WO | 2011/015808 A1 | 2/2011 |
| WO | 2011/139771 A2 | 11/2011 |
| WO | 2011/139774 A2 | 11/2011 |
| WO | 2012/118713 A2 | 9/2012 |
| WO | 2012/143817 A2 | 10/2012 |
| WO | 2012/148884 A2 | 11/2012 |
| WO | 2013/074622 A1 | 5/2013 |
| WO | 2014/053202 A1 | 4/2014 |
| WO | 2015/013396 A1 | 1/2015 |
| WO | 2015/028407 A1 | 3/2015 |
| WO | 2015/120025 A1 | 8/2015 |
| WO | 2016/019210 A1 | 2/2016 |
| WO | 2016/019273 A1 | 2/2016 |
| WO | 2016/019277 A1 | 2/2016 |

OTHER PUBLICATIONS

"LOR and PMGI Resists", MicroChem Data Sheet, 7 pages. (2006).

Sakanoue, T. et al., "Fluorosurfactant-assisted photolithography for patterning of perfluoropolymers and solution-processed organic semiconductors for printed displays", Applied Physics Express, 7: 101602-1-101602-4 (2014).

* cited by examiner

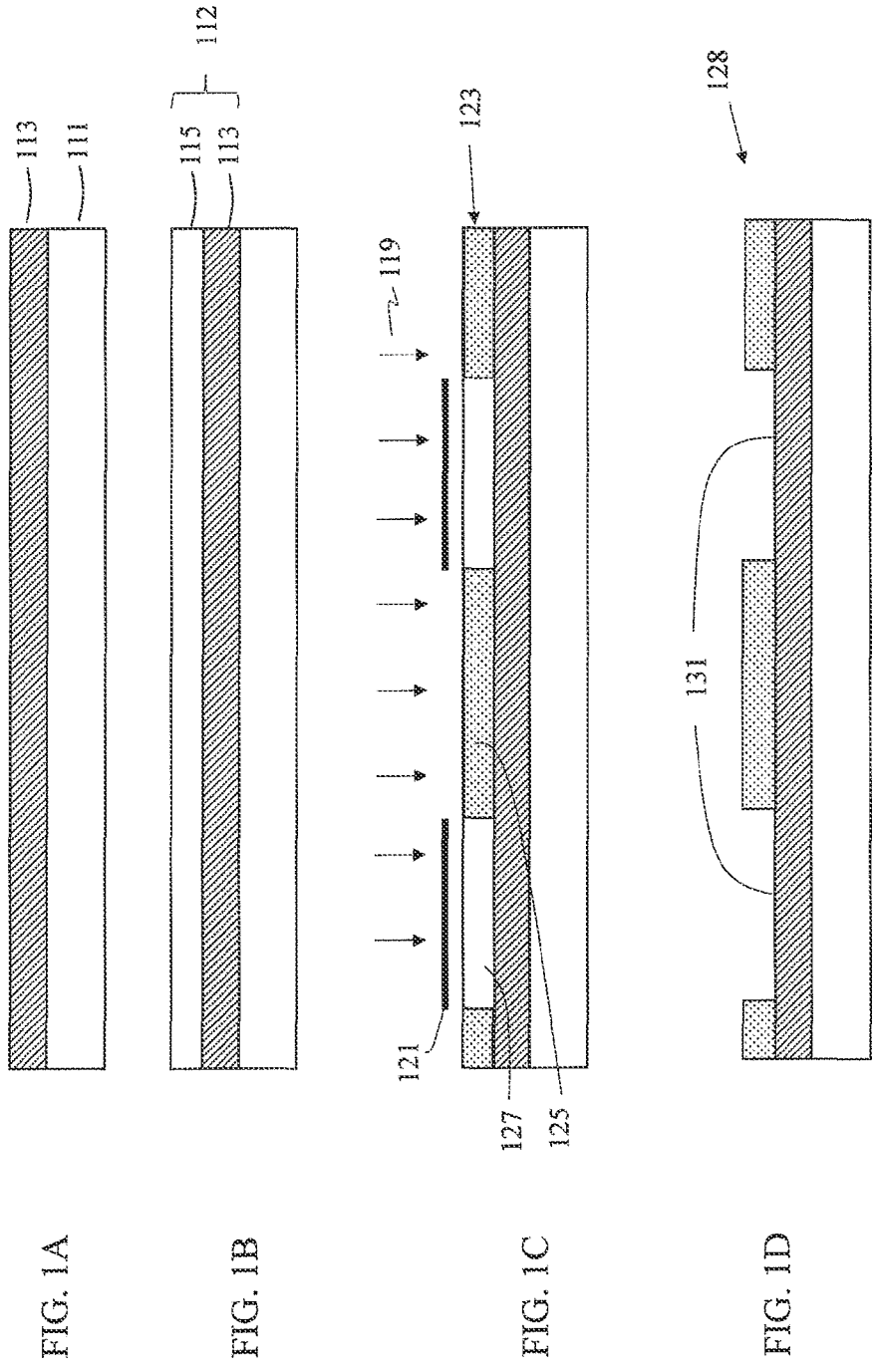

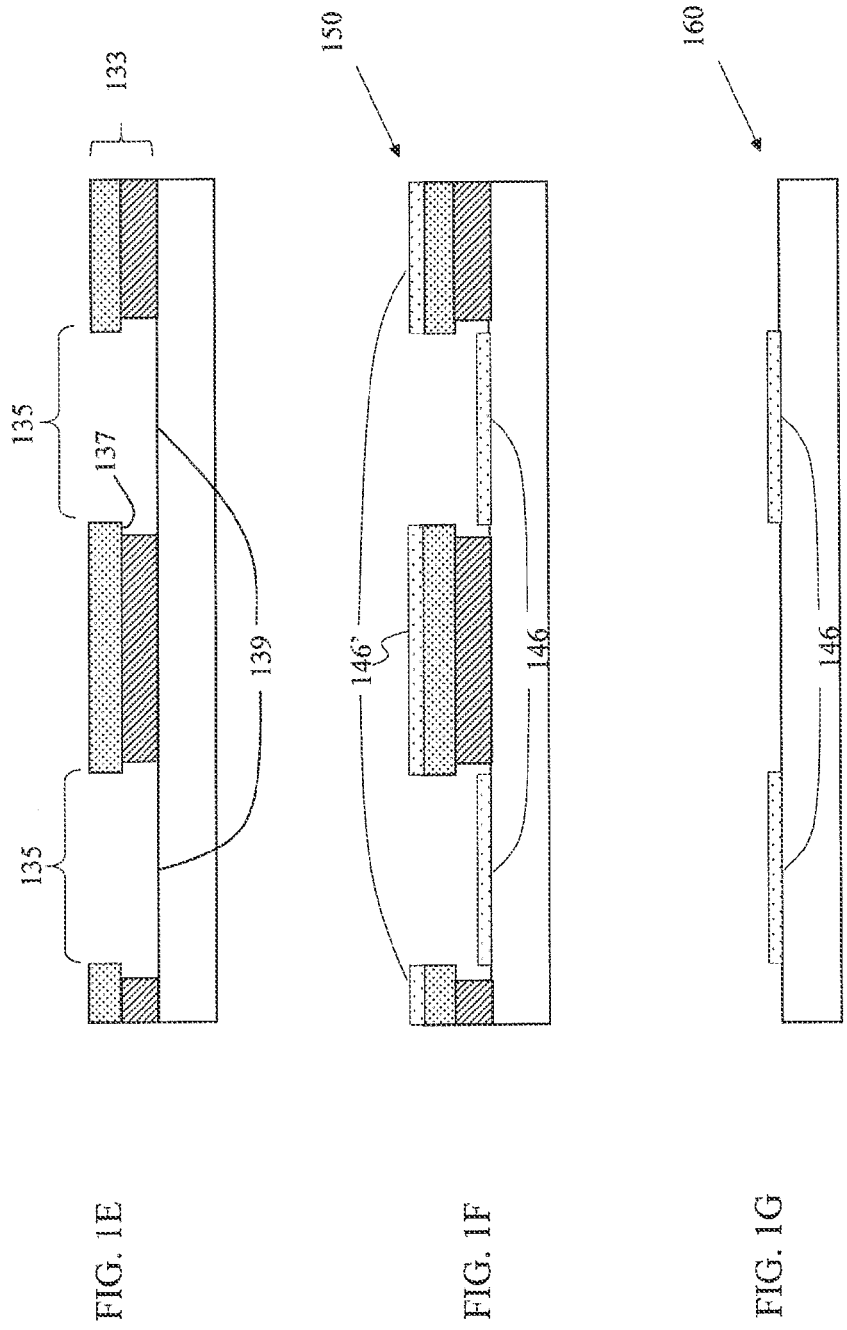

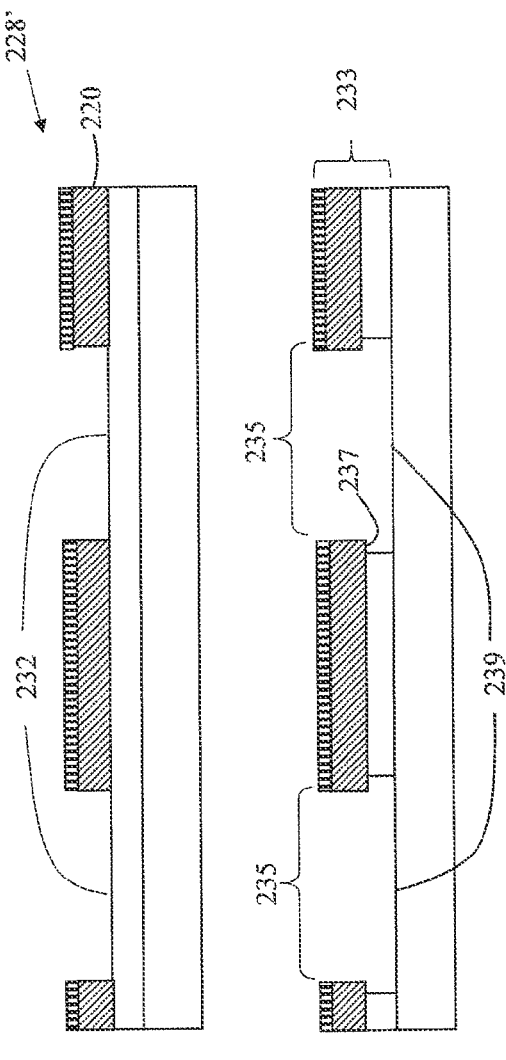

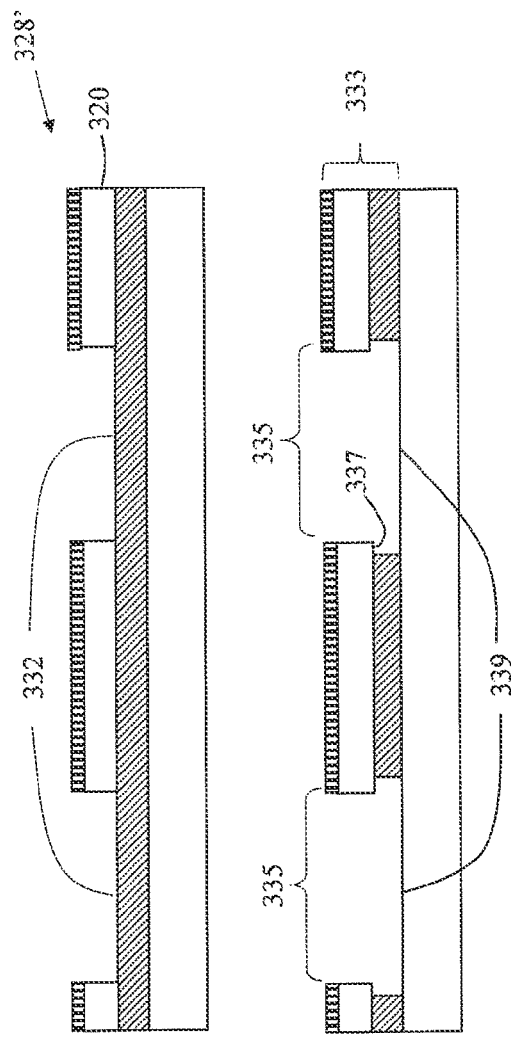

PHOTOLITHOGRAPHIC PATTERNING OF DEVICES

CROSS-REFERENCE TO RELATED APPLICATIONS

This application is a National Stage Application of PCT/US2015/043036 filed on Jul. 31, 2015, which claims the benefit of U.S. Provisional Application No. 62/096,582, filed on Dec. 24, 2014, and U.S. Provisional Application No. 62/031,897, filed on Aug. 1, 2014, and which applications are incorporated herein by reference. A claim of priority is made to each of the above disclosed applications. This application is also related to PCT International Applications Nos. PCT/US2015/043168, PCT/US2015/043175, and PCT/US2015/043034, filed on Jul. 31, 2015 and claiming the benefit of U.S. Provisional Applications Nos. 62/031,888 (filed on Aug. 1, 2014), 62/031,891 (filed on Aug. 1, 2014), and 62/031,903 (filed on Aug. 1, 2014), respectively.

BACKGROUND

The present disclosure relates to patterning of devices such as organic, electronic and organic electronic devices. The disclosed methods and materials are particularly useful for lift-off patterning of organic electronic devices, e.g., for forming OLED devices.

Organic electronic devices may offer significant performance and price advantages relative to conventional inorganic-based devices. As such, there has been much commercial interest in the use of organic materials in electronic device fabrication. For example, displays based on organic light-emitting diode (OLED) technology have recently gained popularity and offer numerous advantages over many other display technologies. Although solution-deposited OLED materials have been developed, the highest-performing OLED devices typically use vapor-deposited thin films of active organic materials.

A key challenge for full-color OLED displays is patterning the array of red, green and blue pixels. For vapor-deposited OLEDs, a fine metal mask having openings corresponding to the fineness of the desired pattern is conventionally used. However, a vapor deposited film builds up on the mask which may eventually narrow the mask openings or cause deforming stresses on the mask. Therefore, it is necessary to clean the mask after a certain number of uses, which is disadvantageous from the viewpoint of manufacturing costs. In addition, when a fine metal mask is increased in size to accommodate larger substrates, the positional accuracy of the mask openings becomes much more difficult, both from the standpoint of initial alignment and then maintaining the alignment during deposition due to thermal expansion issues. Positional accuracy may be improved to a degree by enhancing the stiffness of a frame of the mask, but this increase the weight of the mask itself causes other handling difficulties.

Thus, a need exists for cost-effective patterning of organic electronic devices such as OLED devices, and particularly those having pattern dimensions of less than about 100 μm. There further exists a need for effective lift-off patterning structures that are simple to form, have low interaction with device layers and have manufacturable processing times.

SUMMARY

The present disclosure describes materials and methods that enable significant processing flexibility and an ability to tune different layers to balance different properties, e.g., lift-off rates, development rates, substrate protection, and structural dimensions, all while protecting any sensitive device layers and materials.

In accordance with the present disclosure a method of patterning a device includes: over a device substrate, forming a resist precursor structure including (i) a first fluoropolymer layer including a first fluoropolymer material having a fluorine content of at least 50% by weight and substantially soluble in a first hydrofluoroether solvent or in a first perfluorinated solvent, but substantially less soluble in a second hydrofluoroether solvent relative to both the first hydrofluoroether and the first perfluorinated solvent, and (ii) a second fluoropolymer layer including a second fluoropolymer material having a fluorine content less than that of the first fluoropolymer material and substantially soluble in the first or second hydrofluoroether solvents, but substantially less soluble in the first perfluorinated solvent relative to both the first and second hydrofluoroether solvents; and photolithographically forming a patterned resist structure and a complementary pattern of uncovered substrate, such forming includes contact of at least a portion of the second fluoropolymer layer with a first fluorinated developing agent comprising the first or second hydrofluoroether solvent.

In accordance with another aspect of the present disclosure, a photoresist system includes: a first fluoropolymer composition comprising a first fluoropolymer material having a fluorine content of at least 50% by weight and a first perfluorinated coating solvent or a first hydrofluoroether coating solvent that is saturated having at least four more perfluorinated carbon atoms than hydrogen-containing carbon atoms; and a second fluoropolymer composition comprising a second fluoropolymer material having a fluorine content less than that of the first fluoropolymer material and a second hydrofluoroether solvent that is saturated having fewer than four more perfluorinated carbon atoms than hydrogen-containing atoms and has a fluorine content of at least 60% by weight.

BRIEF DESCRIPTION OF DRAWINGS

FIG. 1 is a series (1A-1G) of cross-sectional views depicting various stages in the formation of a patterned device structure according to an embodiment of the present disclosure;

DETAILED DESCRIPTION

Figure 2A:
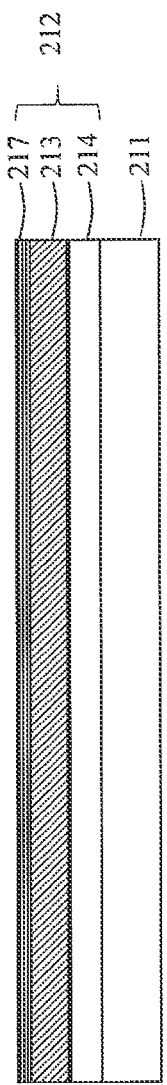
FIG. 2 is a series (2A-2E) of cross-sectional views depicting various stages in the formation of a patterned resist structure according to an embodiment of the present disclosure.

It is to be understood that the attached drawings are for purposes of illustrating the concepts of the disclosure and may not be to scale.

In an embodiment, "orthogonal" resist structures (sometimes referred to herein as photoresist structures or lift-off structures) and processing agents are used that are compatible with sensitive electronic devices and materials such as OLED devices and materials, i.e., they are chosen to have low interaction with sensitive device layers that are not intended to be dissolved or otherwise damaged. Conventional resist materials typically use harsh organic solvents or strongly caustic developers that can easily damage one or more layers of an OLED device or other sensitive devices. Particularly useful orthogonal resist structures and processing agents include fluorinated polymers or molecular solids and fluorinated solvents. Some orthogonal photoresist structures and systems are disclosed in U.S. patent application Ser. Nos. 12/864,407, 12/994.353, 14/113,408, 14/260,705, 14/291,692, 14/335,406, 14/335,476 and 14/539,574, and International Application No. PCT/US2015/014425, the contents of which are incorporated by reference. The patterned resist structures of the present disclosure typically have an undercut profile, which can be advantageous in so-called "lift-off" photolithographic patterning. Orthogonality can be tested by, for example, immersion of a device comprising the material layer of interest into a target composition prior to operation (e.g., into a coating solvent, a developing agent, a lift-off agent, or the like). The composition is orthogonal if there is no serious reduction in the functioning of the device.

Certain embodiments disclosed in the present disclosure are particularly suited to the patterning of solvent-sensitive, active organic materials. Examples of active organic materials include, but are not limited to, organic electronic materials, such as organic semiconductors, organic conductors. OLED (organic light-emitting diode) materials and organic photovoltaic materials, organic optical materials and biological materials (including bioelectronics materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix. The present disclosure is particularly directed towards patterning of OLED devices, but the concepts and methods disclosed herein can be applied to other electronic, optical, organic electronic or bioelectronic devices.

Solvents

Methods of the present disclosure often utilize highly fluorinated solvents due to their orthogonality. Particularly useful highly fluorinated solvents include perfluorinated solvents and hydrofluoroethers (HFEs).

HFE Solvents

There are two main varieties of HFEs useful in the present disclosure: (a) segregated hydrofluoroethers, wherein ether-bonded segments (e.g. alkyl segments) of the HFE are either perfluorinated (e.g., a perfluorocarbon segment) or non-fluorinated (e.g., a hydrocarbon segment), but not partially fluorinated; and (b) non-segregated HFEs, wherein one or both ether-bonded segments are partially fluorinated. In an embodiment, the segments do not include any double bonds (i.e., they are saturated). To be generally useful in the present disclosure, HFEs should have a fluorine content that is at least 50% by weight, preferably at least 60% by weight, in order to properly solubilize the fluoropolymer(s) of the present disclosure. Some HFEs may have multiple ether units or include saturated nitrogen atoms.

Examples of readily available HFEs and isomeric mixtures of HFEs include, but are not limited to, an isomeric mixture of methyl nonafluorobutyl ether and methyl nonafluoroisobutyl ether (HFE-7100 aka Novec™ 7100), an isomeric mixture of ethyl nonafluorobutyl ether and ethyl nonafluoroisobutyl ether (HFE-7200 aka Novec™ 7200), 3-ethoxy-1,1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE-7600 aka PF7600 (from 3M)), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), 2,3,3,4,4-pentafluorotetrahydro-5-methoxy-2,5-bis[1,2,2,2-tetrafluoro-1-(trifluoromethyl)ethyl]-furan (HFE-7700 aka Novec™ 7700) and 1,1,1,2,2,3,3,4,4,5,5,6,6-tridecafluorooctane-propyl ether (TE6O-C3).

In the above list, segregated HFEs include HFE-7100, HFE-7200, HFE-7300, HFE-7500 and HFE-7700. Some additional, non-limiting examples of segregated HFEs include $F(CF_2)_5OCH_3$, $F(CF_2)_6OCH_3$, $F(CF_2)_7OCH_3$, $F(CF_2)_8OCH_2CH_2CH_3$, $F(CF_2)_2O(CF_2)_4OCH_2CH_3$, $F(CF_2)_3OCF(CF_3)CF_2OCH_3$, $(CF_3)_2N(CF_2)_3OCH_3$, $(C_3F_7)_2N(CF_2)_3OC_3H_7$,

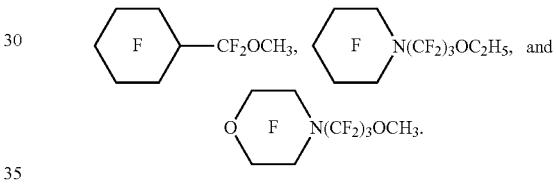

Mixtures of HFE solvents may optionally be used, e.g., as disclosed in U.S. patent application Ser. No. 14/260,666, the entire contents of which are incorporated by reference herein. Boiling points of HFEs in the present disclosure typically range from about 50° C. to 200° C.

Perfluorinated Solvents

There are three primary classes of perfluorinated solvents particularly useful in the present disclosure including: (a) perfluorocarbons such as perfluoroalkyls; (b) perfluoroalkylethers; and (c) perfluoroalkylamines, any of which may optionally have a cyclic structure. Some non-limiting examples of perfluorocarbons include perfluoro-octane, perfluoro-2-methylpentane, perfluoro-1,3-dimethylcyclohexane and perfluorodecalin. Some non-limiting example of a perfluoroalkylamines include perfluorotributylamine, perfluorotriethylamine, perfluorotripentylamine. Numerous Fluorinert™ perfluorinated solvents are available from 3M. Perfluorinated solvents of the present disclosure are generally non-aromatic and typically saturated compounds. Boiling points typically range from about 50° C. to 200° C.

Photopolymer Structures and Device Patterning

Patterned resist structures of the present disclosure have at least a first fluoropolymer layer and a second fluoropolymer layer. The second fluoropolymer layer has a lower fluorine content than the first fluoropolymer layer. In some embodiments, the second fluoropolymer layer is provided over the first fluoropolymer layer. In other embodiments, the first fluoropolymer layer is provided over the second fluoropolymer layer. The resist structures are patterned by photolithography and so at least a top layer of the resist structure is photosensitive. In an embodiment, the top layer is a third photosensitive layer. Alternatively, the top layer is the second fluoropolymer layer that is also photosensitive, i.e., a fluorinated photopolymer.

First Fluoropolymer Layer

The first fluoropolymer layer includes a first fluoropolymer material that is a highly fluorinated molecular solid or polymer (both are referred to herein as a fluoropolymer). The first fluoropolymer has a total fluorine content in a range of 50 to 75% by weight. In an embodiment, the first fluoropolymer material is perfluorinated. In an embodiment, the first fluoropolymer material includes a fluorinated cyclic structure. In an embodiment, the first fluoropolymer material includes a perfluorinated cyclic ether or dioxol. Some non-limiting examples of the first fluoropolymer materials include those having repeating units such as

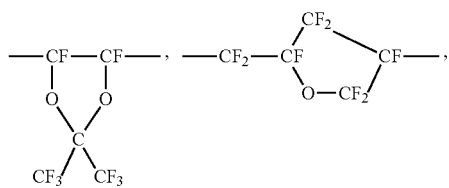

and similar materials. In some embodiments, the cyclic portion may be a copolymer with tetrafluoroethylene-based repeating units or similar materials. Preferably, the first fluoropolymer material is mostly amorphous in nature. Examples of commercially available materials useful as the first fluoropolymer material include Cytop, Teflon AF and Hyflon AD.

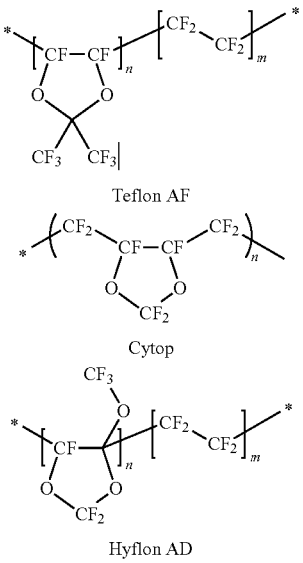

A more generic structure for Cytop-class materials includes

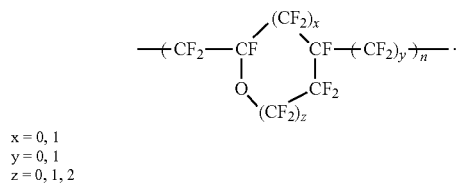

x = 0, 1
y = 0, 1
z = 0, 1, 2

The term "perfluorinated polymers" as used herein includes polymers that are otherwise perfluorinated, but that may include small amounts of non-perfluorinated impurities or terminal groups that may be functionalized in some way with a non-perfluorinated group.

First fluoropolymer materials are often soluble in highly fluorinated solvents, especially perfluorinated solvents. Some non-limiting examples include perfluorodecalin, Fluorinert FC 40 (3M) and CT-Solv-180 (Asahi Glass). They are also substantially soluble in a first-type of HFE solvent, but not a second-type. In an embodiment, the first fluoropolymer material is selected to be soluble in first-type of HFE that is a saturated HFE having at least four more perfluorinated carbon atoms than hydrogen-containing carbon atoms. A carbon atom is perfluorinated if, aside from any bonds to other carbon, oxygen or nitrogen atoms, its valency is completed with one or more fluorine atoms instead of hydrogen. In an embodiment, the first fluoropolymer material is soluble in a first-type of HFE that is a saturated, segregated hydrofluoroether having at least five perfluorinated carbon atoms and less than three hydrogen-containing carbon atoms. Some examples of such "first-type" HFE solvents include HFE-7300, HFE-7500 and HFE-7700.

Some example solvents that do not meet the "first-type" criteria include HFE-7100, HFE-7200, HFE-7600 and HFE-6512. The first fluoropolymer material is typically substantially less soluble in such solvents compared the first-type of HFE solvents defined above. By "substantially less soluble", it is meant herein that the rate of dissolution of a layer of a polymer material in a solvent is ½ or less, preferably ⅕ or less than the rate in another solvent in which the polymer is substantially soluble. By "substantially soluble", it is meant that a layer of a polymer material has a dissolution rate in a solvent that is at least 2 nm/sec. In an embodiment, the dissolution rate of a first fluoropolymer material is at least 2 nm/sec or higher in a perfluorinated solvent or a first-type of HFE, but 1 nm/sec or lower in other HFE solvents.

Second Fluoropolymer Layer

The second fluoropolymer layer includes a second fluoropolymer material having a fluorine content (by weight) less than that of the first fluoropolymer material. In an embodiment, the fluorine content is at least 15% by weight, alternatively at least 25% by weight, alternatively at least 35% by weight, or alternatively at least 45% by weight. When the second fluoropolymer layer is not also acting as a photopolymer, it is preferred that the fluorine content is at least 35% by weight.

In an embodiment, the second fluoropolymer material is a copolymer comprising at least two distinct repeating units including a first repeating unit having a fluorine-containing group and a second repeating unit having a functional group. Incorporation of functional groups other than fluorine-containing groups can be helpful to tailor the solubility of the fluorinated material and may also improve the coatability of compositions comprising the fluorinated copolymer over a device substrate and the coatability of layers that may be provided over the second fluorinated material layer. In an embodiment discussed later with respect to photosensitive fluoropolymers, the functional group may be a solubility-altering reactive group.

In an embodiment, one or more of the repeating units of the copolymer may be formed via a post-polymerization reaction. In this embodiment, an intermediate polymer (a precursor to the desired copolymer) is first prepared, said intermediate polymer comprising suitably reactive functional groups for forming one of more of the specified repeat units. For example, an intermediate polymer containing pendant carboxylic acid moieties can be reacted with a fluorinated alcohol compound in an esterification reaction to produce the specified fluorinated repeating unit. Similarly, a precursor polymer containing an alcohol can be reacted with a suitably derivatized aliphatic hydrocarbon group to form an aliphatic hydrocarbon functional groups. In another example, a polymer containing a suitable leaving group such as primary halide can be reacted with an appropriate compound bearing a phenol moiety to form the desired repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

In an alternative embodiment, the repeating units are formed by polymerization of the appropriate monomers each having a polymerizable group, rather than by attachment to an intermediate polymer. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl esters. Although many of the embodiments below refer to polymerizable monomers, analogous structures and ranges are contemplated and within the scope of the present disclosure wherein one or more of the repeating units are formed instead by attachment to an intermediate polymer, by polymerization or other means.

In an embodiment, the second fluorinated material includes a copolymer formed at least from a first monomer having a fluorine-containing group and a second monomer having a functional group.

The fluorine-containing group of the first monomer or the first repeating unit is preferably an alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated polymer. Throughout this disclosure, unless otherwise specified, any use of the term alkyl includes straight-chain, branched and cyclo alkyls. In an embodiment, the first monomer does not contain protic or charged substituents, such as hydroxy, carboxylic acid, sulfonic acid or the like.

In an embodiment, the first monomer has a structure according to formula (1):

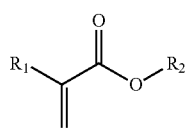

(1)

In formula (1), $R_1$ represents a hydrogen atom, a cyano group, a methyl group or an ethyl group. $R_2$ represents a fluorine-containing group, for example, a substituted or unsubstituted alkyl group having at least 5 fluorine atoms, preferably at least 10 fluorine atoms. In an embodiment, the alkyl group is a hydrofluorocarbon or hydrofluoroether having at least as many fluorine atoms as carbon atoms. In a preferred embodiment $R_2$ represents a perfluorinated alkyl or a 1H,1H,2H,2H-perfluorinated alkyl having at least 4 carbon atoms. An example of the latter would be 1H,1H,2H,2H-perfluorooctyl (aka 2-perfluorohexyl ethyl), and a particularly useful first monomer includes 1H,1H,2H,2H-perfluorooctyl methacrylate ("FOMA") and similar materials.

Some non-limiting examples of polymerizable monomers having a fluorine-containing group include the following.

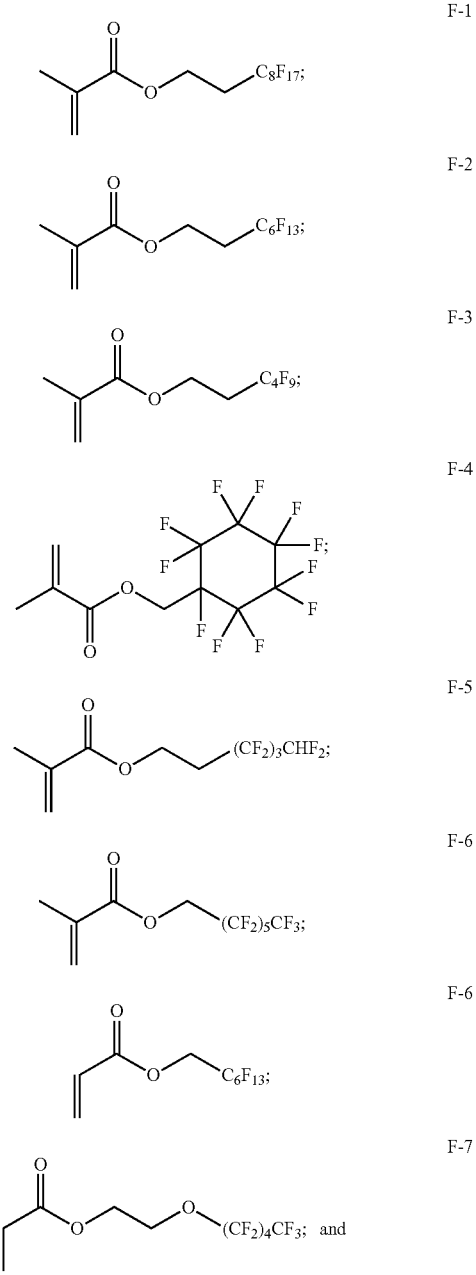

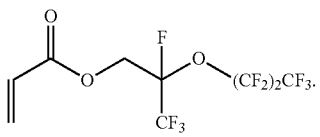

F-8

Multiple "first repeating units" or "first monomers" may be used in the copolymer, i.e., the copolymer may include more than just one type of fluorine-containing group or fluorine-containing first monomer.

The second monomer is one capable of being copolymerized with the first monomer. The second monomer includes a polymerizable group and a functional group as described below. Functional groups generally do not include substantial amounts of fluorine substituents, i.e., they generally include three fluorine atoms or fewer. In an embodiment, the functional groups are not fluorinated.

In an embodiment, the functional group includes a silane or siloxane. Some non-limiting examples of polymerizable monomers incorporating such functional groups are shown below.

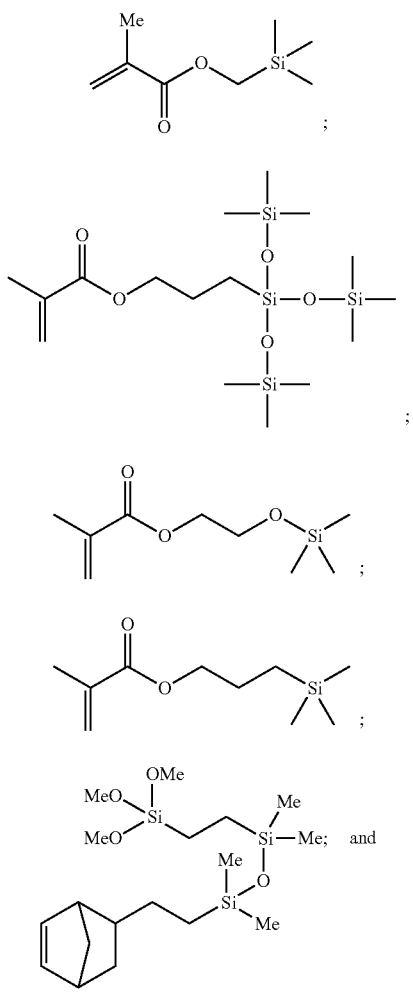

SI-1

SI-2

SI-3

SI-4

SI-5

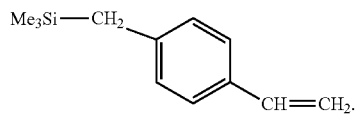

SI-6

In an embodiment, the functional group includes an aromatic hydrocarbon that does not include a protic substituent, but may optionally include an alkyl group, an ether group, an ester groups or a ketone group. Some examples of polymerizable monomers incorporating such functional groups are shown below.

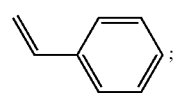

AR-1

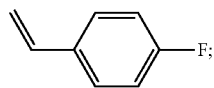

AR-2

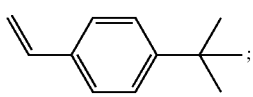

AR-3

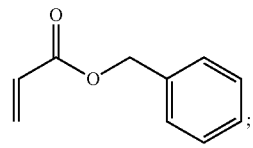

AR-4

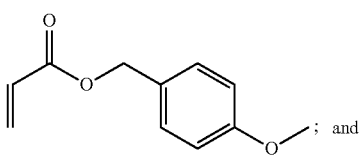

AR-5

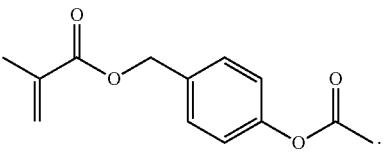

AR-6

In an embodiment, the functional group includes a cyclic or non-cyclic aliphatic hydrocarbon that does not include a protic substituent. The aliphatic hydrocarbon functional group may optionally include non-protic substituents including, but not limited to, ether groups, ester groups, and ketone groups. In an embodiment, the aliphatic hydrocarbon functional group does not include any fluorine substituents. In an embodiment, the copolymer comprising an aliphatic hydrocarbon functional group has a total fluorine content in a range of 46 to 53% by weight. Some non-limiting examples of polymerizable monomers incorporating such functional groups are shown below.

In an embodiment, the functional group includes a protic substituent including, but not limited to alcohol groups, carboxylic acid groups, primary or secondary amine groups, and sulfonic acid groups. In an embodiment, when a functional group includes a protic substituent the copolymer has a total fluorine content of more than 50% by weight.

In an embodiment, the functional group is an alcohol group and the copolymer has a total fluorine content of at least 55% by weight. Alternatively, or in addition, the functional group is an alcohol group and the copolymer has a total hydroxyl group content of less than 1.0% by weight, preferably less than 0.5% by weight. Hydroxyl group content refers to the mass of OH substituents of the alcohol (each having a formula weight of 17 daltons) relative to total mass of the copolymer. Some non-limiting examples of polymerizable monomers incorporating such functional groups are shown below.

In an embodiment, the functional group is carboxylic acid group and the copolymer has a total fluorine content of at least 56% by weight. Alternatively, or in addition, the functional group is a carboxylic acid group and the copolymer has a total hydroxyl group content of less than 0.5% by weight, preferably less than 0.25% by weight. Hydroxyl group content refers to the mass of OH portion of the carboxylic acid substituents (each having a formula weight of 17 daltons) relative to total mass of the copolymer. Some non-limiting examples of polymerizable monomers incorporating such functional groups are shown below.

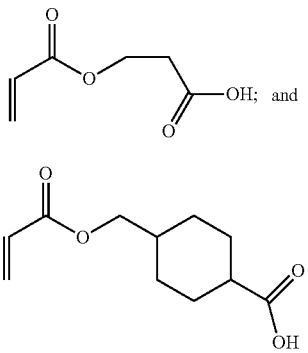

CA-2

CA-3

In an embodiment, copolymers having mixtures of different functional groups may also be used.

Methods for preparing polymers from monomers are generally known in the art. Second fluoropolymer copolymers of the present disclosure may be prepared by dissolving the desired monomers in a reaction solvent such as trifluorotoluene (typically degassed with nitrogen or argon) along with a small amount of a radical initiator such as AIBN or similar material. Typically the reaction mixture is heated, e.g., to above 60° C. for several hours. After cooling to ambient temperature, the copolymer may be precipitated, e.g., in cold methanol, filtered, and then re-dissolved in a target coating solvent, typically a fluorinated solvent such as a hydrofluoroether having a boiling point greater than 90° C. A typical concentration of copolymer for coating is in a range of 5% to 25% by weight of copolymer solids, depending on target coating thickness, solution viscosity and other factors known in the art.

The second fluoropolymer material generally has good solubility in the same "first-type" of HFE solvents useful for dissolving the first fluoropolymer material. Unlike the first fluoropolymer material, however, the second fluoropolymer material is also readily soluble in a second-type of HFE solvent but has poor solubility in most perfluorinated solvents. In an embodiment, the second-type of hydrofluoroether solvent is saturated having fewer than four more perfluorinated carbon atoms than hydrogen-containing atoms. In an embodiment, the second-type hydrofluoroether solvent is a saturated segregated hydrofluoroether having less than five perfluorinated carbon atoms or it is a non-segregated hydrofluoroalkylether. The second-type of HFE solvent typically has a fluorine content of at least 50% by weight, preferably at least 60% by weight, but typically less than about 69%. Some non-limiting examples of second-type HFE solvents include HFE-7100, HFE-7200, HFE-7600 and HFE-6512.

Photosensitive Second Fluoropolymer or Third Photopolymer Layer that is Fluorinated As mentioned, the patterned resist structure is formed by photolithographic methods and at least a top layer of the patterned resist structure is formed from a photosensitive material (photopolymer). In an embodiment, the second fluoropolymer is also photosensitive. In another embodiment, a third photopolymer layer is provided that may also be fluorinated. Below is a description of some fluorinated photopolymers that can be used as the second fluoropolymer layer or as an additional photopolymer layer.

Photosensitive fluoropolymers can be provided, e.g., by coating a photosensitive fluoropolymer composition (also referred to as a fluorinated photopolymer composition) that includes a fluorinated solvent (e.g., a hydrofluoroether), a fluorinated photopolymer material, and optionally additional materials such as sensitizing dyes, photo-acid generator compounds, stabilizers, quenchers and the like. In an embodiment, the fluorinated photopolymer material includes a copolymer comprising at least two distinct repeating units, including a first repeating unit having a fluorine-containing group and a second repeating unit having a solubility-altering reactive group. In an embodiment using a fluorinated photopolymer that is a copolymer, the copolymer has a total fluorine content of at least at least 15%. In an embodiment, the total fluorine content is in a range of 15% to 60%, alternatively 30 to 60%, or alternatively 35 to 55%. The copolymer is suitably a random copolymer, but other copolymer types may be used, e.g., block copolymers, alternating copolymers, and periodic copolymers. The term "repeating unit" herein is used broadly herein and simply means that there is more than one unit. The term is not intended to convey that there is necessarily any particular order or structure with respect to the other repeating units unless specified otherwise. When a repeating unit represents a low mole % of the combined repeating units, there may be only one such unit on a polymer chain. The copolymer may be optionally blended with one or more other polymers, preferably other fluorine-containing polymers. The fluoropolymer may optionally be branched, which may in certain embodiments enable lower fluorine content, faster development and stripping rates, or incorporation of groups that otherwise may have low solubility in a fluorinated polymer. Non-limiting examples of photosensitive fluoropolymer compositions are described in U.S. patent application Ser. Nos. 12/864,407, 12/994,353, 14/113,408, 14/260,705, 14/291,692, 14/335,406, 14/335,476 and 14/539,574, and International Application No. PCT/US2015/014425.

As previously described for the second fluoropolymer material, the specified repeat units may be formed via a post-polymerization reaction or alternatively via direct polymerization of two (or more) appropriate monomers, rather than by attachment to an intermediate polymer. Although many of the embodiments below refer to polymerizable monomers, analogous structures and ranges are contemplated wherein one or more of the first and second repeating units are formed by attachment of the relevant group to an intermediate polymer as described above.

In an embodiment, the fluorinated photopolymer material includes a copolymer formed at least from a first monomer having a fluorine-containing group and a second monomer having a solubility-altering reactive group. Additional monomers may optionally be incorporated into the copolymer. The first monomer is one capable of being copolymerized with the second monomer and has at least one fluorine-containing group. Useful embodiments for the first monomer in a fluorinated photopolymer are essentially the same as those already been described above with respect to the first monomer of the second fluoropolymer material.

The second monomer for the fluorinated photopolymer is one capable of being copolymerized with the first monomer. The second monomer includes a polymerizable group and a solubility-altering reactive group. Some non-limiting examples of useful polymerizable groups include those described for the first monomer.

In an embodiment, the solubility-altering reactive group of the second monomer or second repeating unit is an acid-forming precursor group. Upon exposure to light, the acid-forming precursor group generates a polymer-bound acid group, e.g., a carboxylic or sulfonic acid. This can drastically change its solubility relative to the unexposed regions thereby allowing development of an image with the appropriate solvent. In an embodiment, the developing agent includes a fluorinated solvent that selectively dissolves unexposed areas. In an embodiment, a carboxylic acid-forming precursor is provided from a monomer in a weight percentage range of 4 to 40% relative to the copolymer, or alternatively in a weight percentage range of 10 to 30%. In an embodiment, the developed fluoropolymer pattern does not need to be soluble in a fluorinated stripping solvent since a lower layer will be dissolved to lift off the patterned photosensitive fluoropolymer.

One class of acid-forming precursor groups includes the non-chemically amplified type (e.g., non-acid catalyzed). An example of a second monomer with such a group is 2-nitrobenzyl methacrylate. The non-chemically amplified precursor group may directly absorb light to initiate de-protection of the acid-forming groups. Alternatively, a sensitizing dye may be added to the composition whereby the sensitizing dye absorbs light and forms an excited state capable of directly sensitizing or otherwise initiating the de-protection of acid-forming precursor groups. The sensitizing dye may be added as a small molecule or it may be attached or otherwise incorporated as part of the copolymer. Unlike chemically amplified formulations that rely on generation of an acid (see below), non-chemically amplified photopolymers may sometimes be preferred when a photopolymer is used on or near an acid-sensitive or acid-containing material.

A second class of acid-forming precursor groups includes the chemically amplified type. This typically requires addition of a photo-based generator or a photo-acid generator (PAG) to the photopolymer composition, e.g., as a small molecule additive to the solution. The PAG may function by directly absorbing radiation (e.g. UV light) to cause decomposition of the PAG and release an acid. Alternatively, a sensitizing dye may be added to the composition whereby the sensitizing dye absorbs radiation and forms an excited state capable of reacting with a PAG to generate an acid. The sensitizing dye may be added as a small molecule, e.g., as disclosed in U.S. patent application Ser. No. 14/335,476. The sensitizing dye may be attached to or otherwise incorporated as part of the copolymer, e.g., as disclosed in U.S. patent application Ser. Nos. 14/291,692 and 14/291,767. In an embodiment, the sensitizing dye (either small molecule or attached) is fluorinated. In an embodiment, the sensitizing dye may be provided in a range of 0.5 to 10% by weight relative to the total copolymer weight. The photochemically generated acid catalyzes the de-protection of acid-labile protecting groups of the acid-forming precursor. In some embodiments, chemically amplified photopolymers can be particularly desirable since they enable the exposing step to be performed through the application of relatively low energy UV light exposure. This is advantageous since some active organic materials useful in applications to which the present disclosure pertains may decompose in the presence of UV light, and therefore, reduction of the energy during this step permits the photopolymer to be exposed without causing significant photolytic damage to underlying active organic layers. Also, reduced light exposure times improve the manufacturing throughput of the desired devices.

Examples of acid-forming precursor groups that yield a carboxylic acid include, but are not limited to: A) esters capable of forming, or rearranging to, a tertiary cation, e.g., t-butyl ester, t-amyl ester, 2-methyl-2-adamantyl ester, 1-ethylcyclopentyl ester, and 1-ethylcyclohexyl ester; B) esters of lactone, e.g., γ-butyrolactone-3-yl, γ-butyrolactone-2-yl, mevalonic lactone, 3-methyl-γ-butyrolactone-3-yl, 3-tetrahydrofuranyl, and 3-oxocyclohexyl; C) acetal esters, e.g., 2-tetrahydropyranyl, 2-tetrahydrofuranyl, and 2,3-propylenecarbonate-1-yl; D) beta-cyclic ketone esters, E) alpha-cyclic ether esters; and F) MEEMA (methoxy ethoxy ethyl methacrylate) and other esters which are easily hydrolyzable because of anchimeric assistance. In an embodiment, the second monomer comprises an acrylate-based polymerizable group and a tertiary alkyl ester acid-forming precursor group, e.g., t-butyl methacrylate ("TBMA") or 1-ethylcyclopentyl methacrylate ("ECPMA").

In an embodiment, the solubility-altering reactive group is an hydroxyl-forming precursor group (also referred to herein as an "alcohol-forming precursor group"). The hydroxyl-forming precursor includes an acid-labile protecting group and the photopolymer composition typically includes a PAG compound and operates as a "chemically amplified" type of system. Upon exposure to light, the PAG generates an acid (either directly or via a sensitizing dye as described above), which in turn, catalyzes the deprotection of the hydroxyl-forming precursor group, thereby forming a polymer-bound alcohol (hydroxyl group). This significantly changes its solubility relative to the unexposed regions thereby allowing development of an image with the appropriate solvent (typically fluorinated). In an embodiment, the developing agent includes a fluorinated solvent that selectively dissolves unexposed areas. In an embodiment, an hydroxyl-forming precursor is provided from a monomer in a weight percentage range of 4 to 40% relative to the copolymer.

In an embodiment, the hydroxyl-forming precursor has a structure according to formula (2):

(2)

wherein $R_5$ is a carbon atom that forms part of the second repeating unit or second monomer, and $R_{10}$ is an acid-labile protecting group. Non-limiting examples of useful acid-labile protecting groups include those of formula (AL-1), acetal groups of the formula (AL-2), tertiary alkyl groups of the formula (AL-3) and silane groups of the formula (AL-4).

(AL-1)

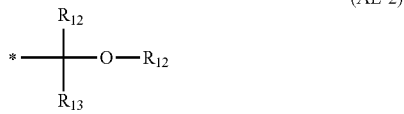

(AL-2)

(AL-3)

(AL-4)

In formula (AL-1), $R_{11}$ is a monovalent hydrocarbon group, typically a straight, branched or cyclic alkyl group, of 1 to 20 carbon atoms that may optionally be substituted with groups that a skilled worker would readily contemplate would not adversely affect the performance of the precursor. In an embodiment, $R_{11}$ may be a tertiary alkyl group. Some representative examples of formula (AL-1) include:

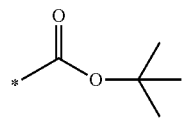

AL-1-1

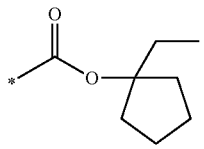

AL-1-2

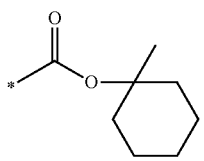

AL-1-3

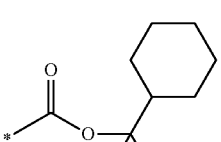

AL-1-4

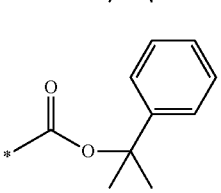

AL-1-5

In formula (AL-2), $R_{14}$ is a monovalent hydrocarbon group, typically a straight, branched or cyclic alkyl group, of 1 to 20 carbon atoms that may optionally be substituted. $R_{12}$ and $R_{13}$ are independently selected hydrogen or a monovalent hydrocarbon group, typically a straight, branched or cyclic alkyl group, of 1 to 20 carbon atoms that may optionally be substituted. Some representative examples of formula (AL-2) include:

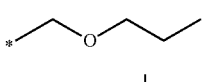

AL-2-1

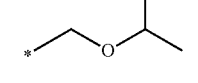

AL-2-2

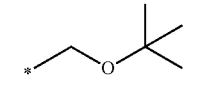

AL-2-3

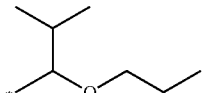

AL-2-4

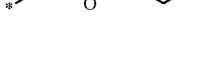

AL-2-5

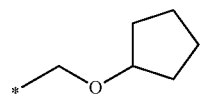

AL-2-6

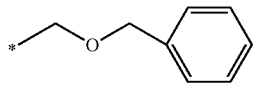

AL-2-7

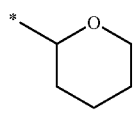

In formula (AL-3), $R_{15}$, $R_{16}$, and $R_{17}$ represent an independently selected a monovalent hydrocarbon group, typically a straight, branched or cyclic alkyl group, of 1 to 20 carbon atoms that may optionally be substituted. Some representative examples of formula (AL-3) include:

AL-3-1

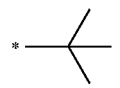

AL-3-2

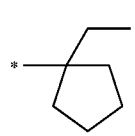

AL-3-3

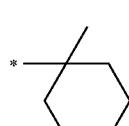

AL-3-4

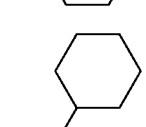

AL-3-5

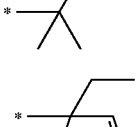

AL-3-6

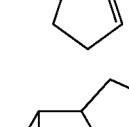

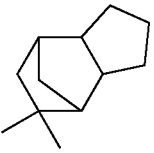

In formula (AL-4), $R_{18}$, $R_{19}$ and $R_{20}$ are independently selected hydrocarbon groups, typically a straight, branched or cyclic alkyl group, of 1 to 20 carbon atoms that may optionally be substituted.

The descriptions of the above acid-labile protecting groups for formulae (AL-2), (AL-3) and (AL-4) have been described in the context of hydroxyl-forming precursors. These same acid-labile protecting groups, when attached instead to a carboxylate group, may also be used to make some of the acid-forming precursor groups described earlier.

In an embodiment, the solubility-altering reactive group is a cross-linkable group, e.g., an acid-catalyzed cross-linkable group or a photo cross-linkable (non-acid catalyzed) group. Photo cross-linkable groups typically have at least one double bond so that when the group forms an excited state (either by direct absorption of light or by excited state transfer from a sensitizing dye), sets of double bonds from adjacent polymer chains crosslink. In an embodiment, the photo cross-linkable group (not catalyzed) comprises a cinnamate that may optionally further include fluorine-containing substituents, as described in International Patent Application No. PCT/US2015/014425. Some non-limiting examples of polymerizable monomers including such cinnamates are shown below.

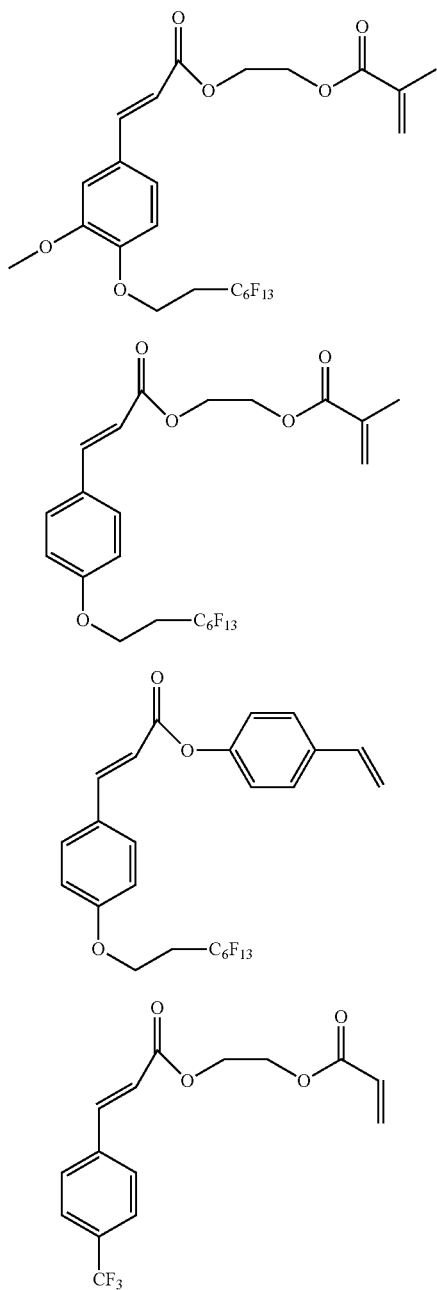

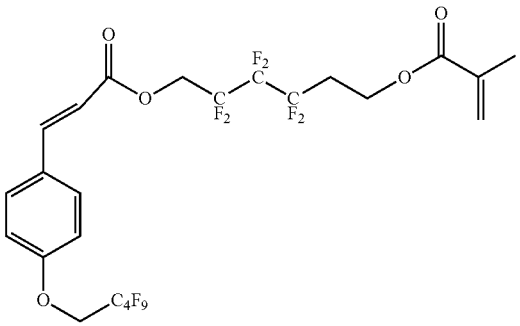

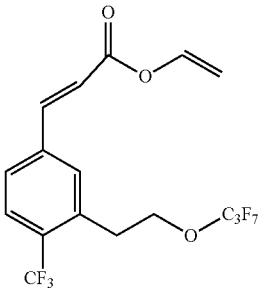

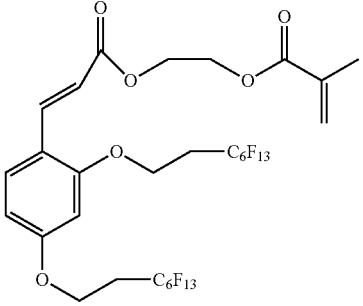

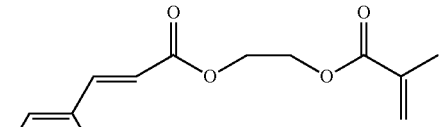

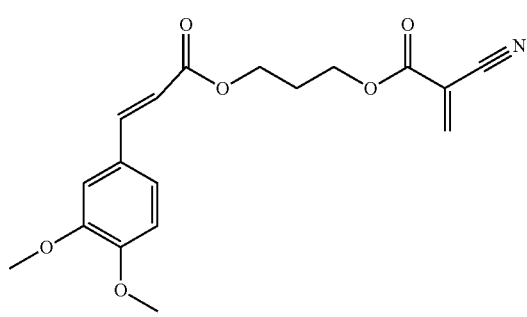

Compositions comprising such materials may optionally further include a sensitizing dye. Some non-limiting examples of useful sensitizing dyes for cinnamate cross-linking groups include diaryl ketones (e.g., benzophenones), arylalkyl ketones (e.g., acetophenones), diaryl butadienes, diaryl diketones (e.g. benzils), xanthones, thioxanthones, naphthalenes, anthracenes, benzanthrone, phenanthrenes, crysens, anthrones, 5-nitroacenapthene, 4-nitroaniline, 3-nitrofluorene, 4-nitromethylaniline, 4-nitrobiphenyl, picramide, 4-nitro-2,6-dichlorodimethylaniline, Michler's ketone, N-acyl-4-nitro-1-naphthylamine.

Examples of acid-catalyzed cross-linkable groups include, but are not limited to, cyclic ether groups and vinyloxy groups. In an embodiment, the cyclic ether is an epoxide or an oxetane. The photopolymer composition including an acid-catalyzed cross-linkable group typically includes a PAG compound and operates as a "chemically amplified" type of system in a manner described above. Upon exposure to light, the PAG generates an acid (either directly or via a sensitizing dye as described above), which in turn, catalyzes the cross-linking of the acid-catalyzed cross-linkable groups. This significantly changes its solubility relative to the unexposed regions thereby allowing development of an image with the appropriate fluorinated solvent. Usually, cross-linking reduces solubility. In an embodiment, the developing agent includes a fluorinated solvent that selectively dissolves unexposed areas, e.g., an HFE solvent. In an embodiment, a cross-linkable group is provided from a monomer in a weight percentage range of 4 to 40% relative to the copolymer.

Some non-limiting examples of some acid-catalyzed cross-linkable groups include the following wherein (*) refers to an attachment site to the polymer or the polymerizable group of a monomer:

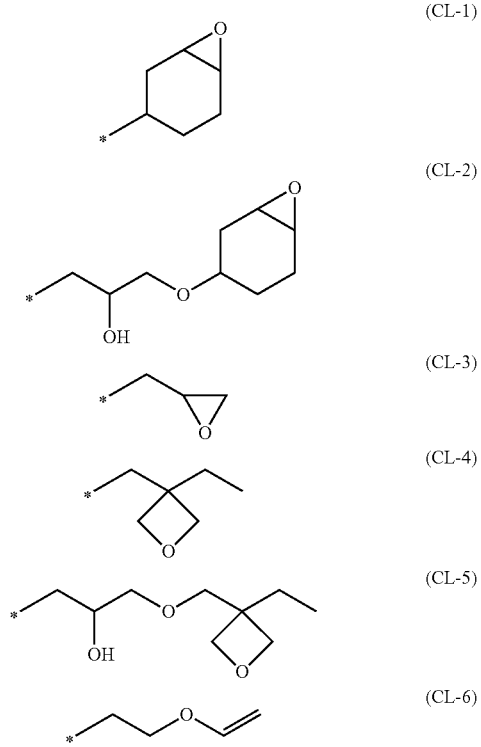

(CL-1)
(CL-2)
(CL-3)
(CL-4)
(CL-5)
(CL-6)

In an embodiment, the solubility-altering reactive groups are ones that, when the photopolymer composition or layer is exposed to light, undergo a bond-breaking reaction to form a material with higher solubility in fluorinated solvents. For example, the solubility-altering reactive groups could be cross-linked and the links are broken upon exposure to light thereby forming lower molecular weight materials. In this embodiment, a fluorinated solvent may be selected to selectively remove exposed areas, thereby acting as a positive photopolymer system.

A combination of multiple second monomers or second repeating units having different solubility-altering reactive groups may be used. For example, a fluorinated photopolymer may comprise both acid-forming and an alcohol-forming precursor groups.

The copolymer may optionally include additional repeating units having other functional groups or purposes. For example, the copolymer may optionally include a repeating unit that adjusts some photopolymer or film property (e.g., solubility, Tg, light absorption, sensitization efficiency, adhesion, surface wetting, etch resistance, dielectric constant, branching, acid-generation, acid-quenching and the like).

Many useful PAG compounds exist that may be added to a photopolymer composition. In the presence of proper exposure and sensitization, this photo-acid generator will liberate an acid, which will react with the second monomer portion of the fluorinated photopolymer material to transform it into a less soluble form with respect to fluorinated solvents. Although it may be provided as a dispersion, the PAG preferably some solubility in the coating solvent. The amount of PAG required depends upon the particular system, but generally, will be in a range of 0.1 to 6% by weight relative to the copolymer. In an embodiment, the amount of PAG is in a range of 0.1 to 2% by weight relative to the copolymer. Fluorinated PAGs are generally preferred and non-ionic PAGs are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate. Suitable PAGs are not limited to those specifically mentioned above and some ionic PAGs can work, too. Combinations of two or more PAGs may be used as well.

Non-Fluorinated Photopolymers

In an embodiment, photolithographic patterning is done using a "conventional" positive or negative-tone photoresist material provided in a third layer over the first and second fluoropolymer layers. The term "conventional" in this context means that the photoresist material is provided from a composition that has one or more non-fluorinated organic solvent as a substantial component (e.g., making up at least 50% of the composition weight) or that its processing (e.g., development) requires aqueous or primarily non-fluorinated organic media. There may be some small amount of fluorination to the conventional "non-fluorinated" photoresist material, but not to a degree that they become substantially soluble in HFE or perfluorinated solvents. Such photoresist materials are well known in the art and some non-limiting examples include those based on poly(methyl methacrylate) (PMMA), poly(methyl glutarimide) (PMGI), phenol formaldehyde resins (DNQ/Novolac) and SU-8. Common photoresist suppliers include AZ Electronic Materials, Fujifilm Electronic Materials, Tokyo Ohka Kogyo Co., Shipley (Rohm & Haas), and MicroChem to name just a few. In an embodiment, the conventional photoresist further includes a fluorinated surfactant or other fluorinated material to improve wetting of the resist on underlying first or second fluoropolymer layer. In an embodiment, the fluorinated surfactant is polymeric. Non-limiting examples of fluorosurfactants include Zonyl FSN (and similar materials from DuPont), Surflon S-386 (and similar materials from AGC Seimi Chemical), and FC-4432 (and similar materials from 3M). Such fluorinated surfactants or materials are typically added at a level less than 10% by weight relative to the photopolymer, alternatively less than 5% by weight relative to the photopolymer. In an embodiment a conventional photoresist is provided as a third layer directly on the first fluoropolymer layer. In an alternative embodiment, the conventional photoresist is provided as a third layer directly on the second fluoropolymer layer. Of the two, the latter is sometimes preferred because wetting over the lower fluorine content polymer is generally easier.

The fluoropolymer and photopolymer layers may be provided from a preformed sheet (e.g., by lamination) or coated from a solution, e.g., by spin coating, curtain coating, doctor-blade coating, dip coating, ink-jet coating, spray application or the like.

General Structure I

FIG. 1 illustrates an embodiment of the present disclosure. In FIG. 1A, a first fluoropolymer layer 113 is formed over a device substrate 111. The structure of the substrate depends upon the desired device. The device substrate may include a support that may be flexible or rigid. Support materials include, but are not limited to, glass, polymers, ceramics and metals, and composites or laminates thereof. The device substrate may include a multilayer structure having various features, e.g., conductors, circuitry, dielectrics, semiconductors, optical layers and the like. One non-limiting example of such a device includes an OLED device, but the device may instead be an organic photovoltaic, an OTFT, a touch sensor, a chemical sensor, a bioelectronic or medical device, or any device that uses one or more active organic materials, or any material layer that is sensitive to conventional solvents. In the present embodiment, the first fluoropolymer layer may be provided by coating a composition including a first fluoropolymer material and a first fluorinated coating solvent that is preferably a perfluorinated solvent or a first-type of HFE or a mixture thereof. In some embodiments, the composition may include other solvents (e.g., second-type of HFE or organic solvents) in lesser amounts relative to the first fluorinated coating solvent.

In FIG. 1B, a photosensitive second fluoropolymer layer 115 (sometimes referred to as a fluorinated photopolymer layer) is provided over the first fluoropolymer layer 113 to form resist precursor structure 112. In the present embodiment, the photosensitive second fluoropolymer layer 115 is provided by coating a composition including a photosensitive second fluoropolymer material and a second fluorinated coating solvent this is preferably a second-type of HFE. In some embodiments, the composition may include other solvents (e.g., a first-type of HFE, a perfluorinated solvent or an organic solvent) in lesser amounts relative to the second fluorinated coating solvent. The second fluorinated coating solvent does not substantially dissolve the underlying first fluoropolymer layer, thereby forming a discrete coating having only a relatively small or no intermix region between the layers. Although the second fluorinated coating solvent does not substantially dissolve the first fluoropolymer layer, the second fluoropolymer material composition typically wets very well over the first fluoropolymer layer providing a uniform coating.

Turning to FIG. 1C, the photosensitive second fluoropolymer 115 is exposed to patterned radiation by providing a radiation source 119 and an intervening photomask 121. This forms an exposed photosensitive second fluoropolymer layer 123 having a pattern of exposed regions 125 and a complementary pattern of unexposed regions 127. In this case, the fluorinated photopolymer is a negative tone type, but a positive tone could be used instead. Other methods of photopatterning may optionally be used, e.g., projection exposure, patterned laser exposure and the like. Next, the exposed photosensitive second fluoropolymer layer is developed by contact with a developing agent that dissolves unexposed portions. Such contact may be by immersion, spray coating, "puddling" or any other convenient method to apply a liquid.

In an embodiment, the developing agent includes a second-type of HFE as the primary component which does not substantially dissolve the first fluoropolymer layer. As shown in FIG. 1D, this removes unexposed regions 127 to form a patterned resist precursor structure 128 having a pattern of uncovered fluoropolymer layer 131 while retaining the pattern of exposed photopolymer regions and underlying first fluoropolymer layer. The patterned resist precursor structure 128 is contacted with a second developing agent that transfers the pattern of exposed photopolymer regions to the underlying first fluoropolymer layer by dissolving the uncovered portion of first fluoropolymer layer. The second developing agent may include as a primary component a perfluorinated solvent or a first-type of HFE or a combination thereof. As shown in FIG. 1E, this forms patterned resist structure 133 having a pattern of openings 135 corresponding to the pattern of unexposed regions of the photosensitive polymer. In this embodiment, the patterned removal of the first fluoropolymer layer forms an optional undercut region 137 and further forms a pattern of uncovered substrate 139 corresponding to the pattern of unexposed regions of the photosensitive polymer. In the present disclosure, a pattern that is "corresponding to" another pattern has at least a similar general shape, but may not necessarily be exactly the same. For example, the pattern of uncovered substrate 139 is slightly larger in size than the pattern of openings 135, due to the undercut.

In an alternative embodiment, the fluorinated photopolymer developing agent includes a first-type of HFE as a primary component, rather than a second-type HFE. Using a first-type of HFE can remove both the unexposed fluorinated photopolymer and underlying first fluoropolymer to form the structure of FIG. 1E (with or without the undercut) in a single development step. That is, the structure of FIG. 1D is basically a transient structure in this single step. It has been found that this can shorten overall processing complexity and takt time to produce an effective structure. On the other hand, it has been unexpectedly found that a fluorinated photopolymer developing agent that includes a second-type of HFE can result in better control of the fluorinated photopolymer image and subsequent development of the first fluoropolymer layer can be controlled better to form more precise structures.

The patterned resist structure 133 can be used to pattern the underlying device substrate by subjecting it to some kind of treatment, e.g., surface modification, doping, etching or deposition. In FIG. 1F, one or more device material layer(s) having one or more device materials are deposited over the patterned resist structure (labelled 146') and through opening 135 onto the device substrate (labelled 146) to form an intermediate structure 150. There is no particular limitation regarding the type or function of the device materials. For example, the device material may include an active organic material, a metal, a metal oxide, a semiconductor, an optical material, a passivation material or a biological material. Prior to deposition of such device materials, the structure may optionally be subjected to a cleaning step to remove residual fluoropolymer, e.g., a treatment with an oxygen plasma, a non-oxidizing plasma, or a cleaning agent comprising fluorinated solvent.

The intermediate device structure 150 is contacted with a lift-off agent including as a primary component a perfluorinated solvent or a first-type of HFE. The lift off agent dissolves the remaining first fluoropolymer layer but not the exposed portions of the photopolymer, thereby removing (by lift-off) the top layer of the patterned resist structure (in this case the exposed portions of the photopolymer) and any overlying materials. This forms patterned device structure 160 having the patterned device material layer 146 as shown in FIG. 1G. In an embodiment, the density of the lift-off agent is greater than the average density of the patterned photopolymer and overlying material layers. The lift-off agent may optionally be heated to speed the lift-off step so long as such heating is compatible with the device structure.

An advantage of the above embodiment is that all of the processing solvents can potentially be orthogonal fluorinated solvents. Although the photosensitive fluoropolymer is often fully orthogonal to underlying substrates, there are some instances where a component of the photosensitive fluoropolymer (a PAG, a quencher, a photo-byproduct or the like) can adversely affect the underlying substrate. The intervening first fluoropolymer can reduce or prevent such interactions of the photopolymer. The above embodiments provide significant processing flexibility and an ability to tune different layers to balance different properties, e.g., lift-off rates, development rates, substrate protection, and structural dimensions.

General Structure IA

In a variation of General Structure I, rather than using a photosensitive second fluoropolymer layer, one can use certain non-fluorinated photopolymers or a photopolymer having low-fluorine content that are soluble in a second fluorinated coating solvent, preferably a second-type of HFE. In an embodiment, the photopolymer includes at least a first repeating unit having an acid-catalyzed, solubility-altering reactive group, wherein the total fluorine content of the photopolymer is less than 30% by weight as disclosed in U.S. Ser. No. 14/274,816, the contents of which are incorporated by reference. An example of a photopolymer that have low or no fluorination but that are surprisingly soluble in second-type HFE solvents is poly-TBMA. In this instance, development is typically not done using first-type HFE solvents, but rather second-type HFE solvents. Alternatively, due to the low fluorination, conventional TMAH aqueous developers may be used to dissolve exposed portions that have "switched" to form carboxylic acid groups (a positive tone resist). Because of the underlying first fluoropolymer, there is no damage to device structures. Because of the fluorinated coating solvent, such photopolymers wet and coat much more uniformly over the first fluoropolymer layer than conventional photoresists that coat from PGMEA and similar organic solvents. The first fluoropolymer layer may be developed as previously described.

General Structure II

Figure 2B:
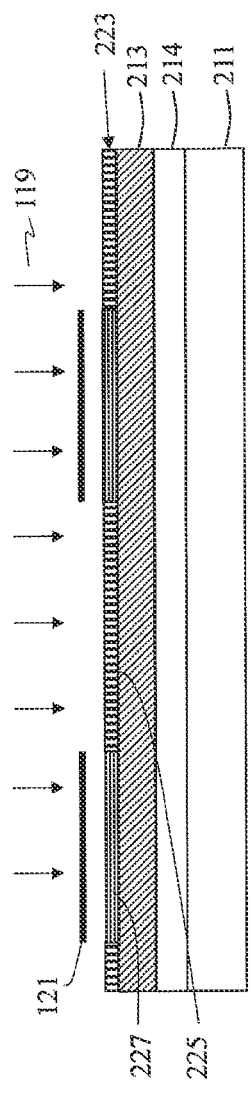
Figure 2C:
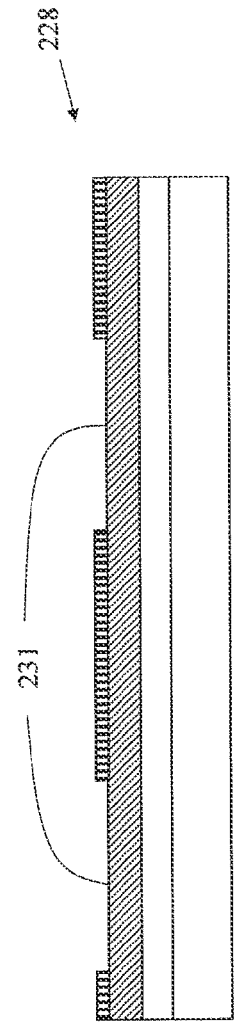

FIG. 2 illustrates another embodiment of the present disclosure. In FIG. 2A, a second fluoropolymer layer 214 is formed over a device substrate 211. In the present embodiment, the second fluoropolymer layer may be provided by coating a composition including a second fluoropolymer material and a second fluorinated coating solvent that is preferably a first-type or second-type of HFE or a mixture thereof. In some embodiments, the composition may include other solvents (e.g., perfluorinated or organic solvents) in lesser amounts relative to the second fluorinated coating solvent. A first fluoropolymer layer 213 is provided over the second fluoropolymer layer 214. In the present embodiment, the first fluoropolymer layer is provided by coating a composition including a first fluoropolymer material and a first fluorinated coating solvent this is preferably a perfluorinated solvent. In some embodiments, the composition may include other solvents (e.g., HFE or an organic solvent) in lesser amounts relative to the first fluorinated coating solvent. The first fluorinated coating solvent does not substantially dissolve the underlying second fluoropolymer layer, thereby forming a discrete coating having only a relatively small or no intermix region between the layers. Although the first fluorinated coating solvent does not substantially dissolve the second fluoropolymer layer, the first fluoropolymer material composition typically wets very well over the second fluoropolymer layer thereby providing a uniform coating. Over the first fluoropolymer layer is provided a photopolymer layer 217 to form resist precursor structure 212. The photopolymer layer may be a conventional photopolymer (photoresist) or a fluorinated photopolymer as described previously. If a fluorinated photopolymer is used, similar methods may be used as described with respect to FIG. 1. If a conventional photoresist is used, it can often be beneficial to add a fluorosurfactant as mentioned previously.

As shown in FIG. 2B, the photopolymer layer 217 is exposed to patterned radiation by providing a radiation source 119 and an intervening photomask 121. This forms an exposed photopolymer layer 223 having a pattern of exposed regions 225 and a complementary pattern of unexposed regions 227. In the present embodiment, the photopolymer layer is a negative tone material, but a positive tone could be used instead. The exposed photopolymer layer is developed by contact with a photopolymer developing agent that dissolves unexposed portions.

In an embodiment, as shown in FIG. 1C, the photopolymer developing agent includes a second-type of HFE (if the photopolymer is a fluorinated photopolymer) as the primary component which does not substantially dissolve the first fluoropolymer layer. Alternatively, the photopolymer is a conventional photoresist and the photopolymer developing agent is an aqueous solution or based on an organic solvent, neither of which substantially dissolves the first fluoropolymer layer. The photopolymer developing agent removes unexposed regions 227 to form a patterned resist precursor structure 228 having a pattern of uncovered fluoropolymer layer 231 while retaining the pattern of exposed photopolymer regions and underlying first fluoropolymer and second fluoropolymer layers.

The patterned resist precursor structure 228 is contacted with a second developing agent that transfers the pattern of exposed photopolymer regions to the underlying first fluoropolymer layer by dissolving the uncovered portion of first fluoropolymer layer. The second developing agent may include as a primary component a perfluorinated solvent or a first-type of HFE or a combination thereof. In an embodiment using a perfluorinated solvent shown in FIG. 2D, this forms a second patterned resist precursor structure 228' having a patterned first fluoropolymer layer 220 corresponding to the pattern of exposed photopolymer and a pattern of uncovered second fluoropolymer layer 232 corresponding to the pattern of unexposed photopolymer. In FIG. 2D an undercut is not shown, but it may optionally be formed if so desired.

In FIG. 2E, the second patterned resist precursor structure 228' is contacted with a third developing agent to transfer the patterns to the underlying second fluoropolymer layer. The third developing agent may include as a primary component a first-type or second-type HFE. Note that if a first-type HFE is used, some additional dissolution of first fluoropolymer layer is likely. In FIG. 2E, a second-type HFE is used thereby forming a patterned resist structure 233 having a first pattern of openings 235 corresponding to the pattern of unexposed regions of the photopolymer. In this embodiment, the patterned removal of the first fluoropolymer layer forms an optional undercut region 237 and further forms a pattern of uncovered substrate 239 corresponding to the pattern of unexposed regions of the photosensitive polymer. The patterned resist structure 233 can be used to pattern the underlying device substrate by subjecting it to some kind of treatment, e.g., surface modification, doping, etching or deposition, as previously described.

There are several variations available for producing the structure of FIG. 2E from FIG. 2B. In one variation, the photopolymer layer is a fluorinated photopolymer, and rather than using a developing agent based on a second-type of HFE, a first-type of HFE is used. This can directly develop all three layers in a single step. In another variation, the intermediate structure 228, whether based on a conventional photoresist or a fluorinated photopolymer, is contacted with a developing agent having a first-type of HFE thereby dissolving both the first and second fluoropolymer layers. As mentioned above, a common developing agent for multiples can reduce processing complexity and takt time to form effective structures, but more precise control of fine features can sometimes be attained by using developing agents specially tuned for the particular layer.

After treating the device substrate as mentioned above, an intermediate device structure can be contacted with a lift-off agent to remove the top layer of the resist structure. In an embodiment, the lift-off agent includes as a primary component a perfluorinated solvent to selectively lift-off the top photopolymer layer by dissolution of the middle first fluoropolymer layer and leaving behind the patterned second fluoropolymer layer. By leaving the second fluoropolymer in place, it can protect underlying substrate from subsequent processing steps. In another embodiment, the lift-off agent includes as a primary component a second-type of HFE. This selectively dissolves the bottom second fluoropolymer layer thereby lifting off both the first fluoropolymer layer and the top photopolymer layer. In another embodiment, a first-type of HFE is used to dissolve both the patterned first and second fluoropolymer layers, thereby lifting off the top photopolymer.

The above embodiments provide significant processing flexibility and an ability to tune different layers to balance different properties, e.g., lift-off rates, development rates, substrate protection, and structural dimensions. It has been found that a wider range of HFE solvents can be used to solubilize the second fluoropolymer layer materials, some with very fast rates. Thus, in an embodiment, General Structure II protects underlying device substrate from potentially harmful photopolymer materials (solvents, photo-by-products, etc.) but also preserves the ability to rapidly lift-off the structure at room temperature.

General Structure III

Figure 3A:
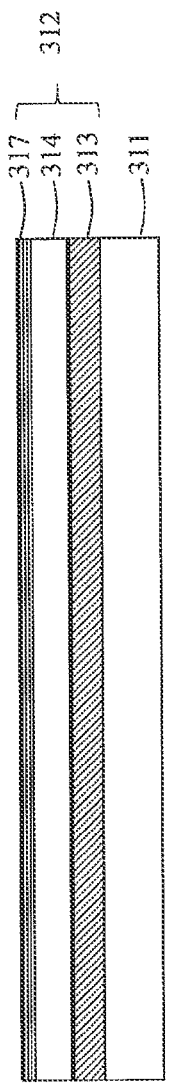
FIG. 3 is a series (3A-3E) of cross-sectional views depicting various stages in the formation of a patterned resist structure according to another embodiment of the present disclosure.

FIG. 3 illustrates another embodiment of the present disclosure. It is similar to the embodiment shown in FIG. 2A, but with the first and second fluoropolymer layers switched in position. In FIG. 3A, a first fluoropolymer layer 313 is formed over a device substrate 311. In the present embodiment, the first fluoropolymer layer may be provided by coating a composition including a first fluoropolymer material and a first fluorinated coating solvent that is preferably a perfluorinated solvent or a first-type of HFE or a mixture thereof. In some embodiments, the composition may include other solvents (e.g., second-type HFE or organic solvents) in lesser amounts relative to the first fluorinated coating solvent. A second fluoropolymer layer 314 is provided over the first fluoropolymer layer 313. In the present embodiment, the second fluoropolymer layer is provided by coating a composition including a second fluoropolymer material and a second fluorinated coating solvent this is preferably a second-type HFE. In some embodiments, the composition may include other solvents (e.g., perfluorinated solvent, first-type HFE or an organic solvent) in lesser amounts relative to the second fluorinated coating solvent. The second fluorinated coating solvent does not substantially dissolve the underlying first fluoropolymer layer, thereby forming a discrete coating having only a relatively small or no intermix region between the layers. Although the second fluorinated coating solvent does not substantially dissolve the first fluoropolymer layer, the second fluoropolymer material composition typically wets very well over the first fluoropolymer layer thereby providing a uniform coating. Over the second fluoropolymer layer is provided a photopolymer layer 317 to form resist precursor structure 312. The photopolymer layer in this embodiment is preferably a conventional photopolymer (photoresist). Due to the lower fluorine content of the second fluoropolymer layer, the conventional photopolymer is often easier to coat onto the second fluoropolymer layer than it is onto the first fluoropolymer layer and is less likely to require a fluorosurfactant (although such fluorosurfactant can be used in any event). Although the authors have found that some conventional coating solvents can penetrate the second fluoropolymer layer, the first fluoropolymer layer is more resistant. In an embodiment the first fluoropolymer layer is at least 300 nm thick.

Figure 3B:
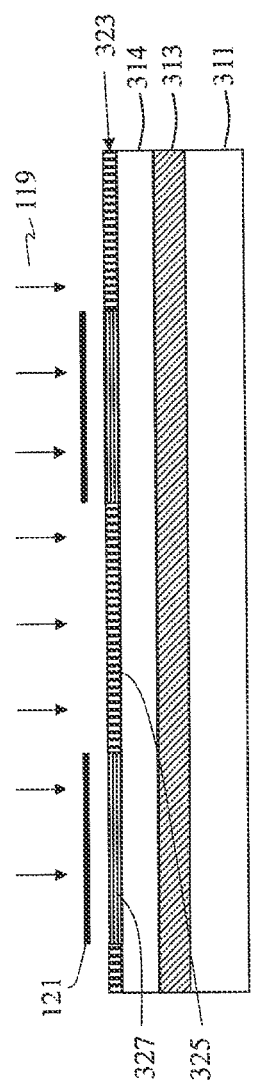

As shown in FIG. 3B, the photopolymer layer 317 is exposed to patterned radiation by providing a radiation source 119 and an intervening photomask 121. This forms an exposed photopolymer layer 323 having a pattern of exposed regions 325 and a complementary pattern of unexposed regions 327. The exposed photopolymer layer is developed by contact with a photopolymer developing agent that dissolves unexposed portions (negative tone). In an alternative embodiment, the developing agent dissolves exposed portions (positive tone).

Figure 3C:
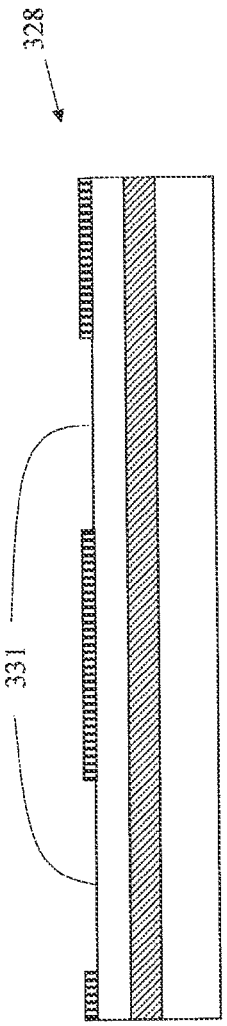

In an embodiment, as shown in FIG. 3C, the photopolymer developing agent includes an aqueous solution or is based on an organic solvent, neither of which substantially dissolves the underlying fluoropolymer layer. The photopolymer developing agent removes unexposed regions 327 to form a patterned resist precursor structure 328 having a pattern of uncovered fluoropolymer layer 331 while retaining the pattern of exposed photopolymer regions and underlying second fluoropolymer and first fluoropolymer layers.

The patterned resist precursor structure 328 is contacted with a second developing agent that transfers the pattern of exposed photopolymer regions to the underlying second fluoropolymer layer by dissolving the uncovered portion of the second fluoropolymer layer. The second developing agent may include as a primary solvent a first-type of HFE, a second-type of HFE or a combination thereof. In an embodiment using a second-type HFE (FIG. 3D), a second patterned resist precursor structure 328' is formed having a patterned second fluoropolymer layer 320 corresponding to the pattern of exposed photopolymer and a pattern of uncovered first fluoropolymer layer 332 corresponding to the pattern of unexposed photopolymer. In FIG. 3D an undercut is not shown, but it may optionally be formed if so desired.

In FIG. 3E, the second patterned resist precursor structure 328' is contacted with a third developing agent to transfer the patterns to the underlying first fluoropolymer layer. The third developing agent may include as a primary component a first-type HFE or a perfluorinated solvent. Note that if a first-type HFE is used, some additional dissolution of second fluoropolymer layer is likely. In FIG. 3E, a perfluorinated solvent is used thereby forming a patterned resist structure 333 having a first pattern of openings 335 corresponding to the pattern of unexposed regions of the photopolymer. In this embodiment, the patterned removal of the first fluoropolymer layer forms an undercut region 337 and further forms a pattern of uncovered substrate 339 corresponding to the pattern of unexposed regions of the photosensitive polymer. The patterned resist structure 333 can be used to pattern the underlying device substrate by subjecting it to some kind of treatment, e.g., surface modification, doping, etching or deposition, as previously described.

There are a number of variations available for producing the structure of FIG. 3E from FIG. 3C. In one variation, rather than using a second developing agent based on a second-type of HFE, a first-type of HFE is used. This can directly develop both fluoropolymer layers in a single step.

After treating the device substrate as mentioned above, an intermediate device structure can be contacted with a lift-off agent to remove the top layer of the patterned resist structure. In an embodiment, the lift-off agent includes as a primary component a second-type HFE solvent to selectively lift-off the top photopolymer layer by dissolution of the middle second fluoropolymer layer and leaving behind the patterned first fluoropolymer layer. By leaving the first fluoropolymer in place, it can protect underlying substrate from subsequent processing steps. Further, as mentioned earlier, the middle second fluoropolymer layer can use materials that dissolve rapidly in a wide range HFEs. Thus, in an embodiment. General Structure III protects underlying device substrate from potentially harmful photopolymer materials (solvents, photo-byproducts, etc.) but also preserves the ability to rapidly lift-off the structure at room temperature. The lift-off agent may optionally be heated so long as it does not affect the device structure. In a related embodiment, the authors have found that the above method can be used simply to pattern a first fluoropolymer layer such as Cytop without ever exposing the underlying device to any harsh solvents. That is, rather than treating the device substrate, lift-off can be performed using a second-type HFE solvent to leave the patterned first fluoropolymer layer which remains part of the device.

In another embodiment, the lift-off agent includes as a primary component a perfluorinated solvent. This selectively dissolves the bottom second fluoropolymer layer thereby lifting off both the second fluoropolymer layer and the top photopolymer layer. In another embodiment, a first-type of HFE is used to dissolve both the patterned first and second fluoropolymer layers, thereby lifting off the top photopolymer. Again, the lift-off agent may optionally be heated so long as it does not affect the device structure.

After lift-off, any of the above structures may optionally be contacted with a cleaning agent having a chemical composition different from the lift-off agent, the cleaning agent including a fluorinated solvent. For example, the cleaning agent may include a fluorinated solvent and a protic solvent such as an alcohol (e.g. IPA) at 15% or less by volume, alternatively 5% or less by volume. Alternatively, the protic solvent may include an organic acid at 5% or less by weight or alternatively 1% or less by weight. Alternatively, the cleaning agent may include a mixture of two fluorinated solvents, e.g., a mixture of a fluorinated solvent used in the lift-off agent and a second fluorinated solvent that is more polar or has less fluorine content by weight or both. Such treatment can be used to remove very small amounts of residue left behind by the process.

The above embodiments described with respect to provide significant processing flexibility and an ability to tune different layers to balance different properties, e.g., lift-off rates, development rates, substrate protection, and structural dimensions, all while protecting any sensitive device layers and materials.

Some non-limiting embodiments of the present disclosure are described below.

1. A method of patterning a device, comprising:
  a) over a device substrate, forming a resist precursor structure including
    i) a first fluoropolymer layer including a first fluoropolymer material having a fluorine content of at least 50% by weight and substantially soluble in a first hydrofluoroether solvent or in a first perfluorinated solvent, but substantially less soluble in a second hydrofluoroether solvent relative to both the first hydrofluoroether and the first perfluorinated solvent, and
    ii) a second fluoropolymer layer including a second fluoropolymer material having a fluorine content less than that of the first fluoropolymer material and substantially soluble in the first or second hydrofluoroether solvents, but substantially less soluble in the first perfluorinated solvent relative to both the first and second hydrofluoroether solvents; and
  b) photo-lithographically forming a patterned resist structure and a complementary pattern of uncovered substrate, such forming includes contact of at least a portion of the second fluoropolymer layer with a first fluorinated developing agent comprising the first or second hydrofluoroether solvent.

2. The method of embodiment 1 further including treating the device substrate to form an intermediate patterned device structure, wherein the patterned resist structure acts as mask.

3. The method according to embodiment 1 or 2 further including removing a top layer of the patterned resist structure by contact with a lift-off agent comprising a third hydrofluoroether solvent that is optionally the same as the first hydrofluoroether solvent or the second hydrofluoroether solvent, or a second perfluorinated solvent that is optionally the same as first perfluorinated solvent.

4. The method according to any of embodiments 1-3 wherein the resist precursor structure further comprises a third photopolymer layer provided over the first and second fluoropolymer layers.

5. The method according to embodiment 4 wherein the third photopolymer layer is provided from a photosensitive polymer material composition comprising at least 50% by weight of one or more non-fluorinated coating solvents.

6. The method according to embodiment 5 wherein the photo-lithographically forming step includes exposing the third photopolymer layer to patterned radiation to form an exposed photopolymer layer and contacting the exposed photopolymer layer with an aqueous or non-fluorinated organic developing agent to form a first pattern of photopolymer and a complementary second pattern of uncovered fluoropolymer.

7. The method according to embodiment 6 wherein the first fluorinated developing agent comprises the first hydrofluoroether thereby removing uncovered portions of the first and second fluoropolymer layers to form the patterned resist structure and the complementary pattern of uncovered substrate corresponding to the second pattern.

8. The method according to embodiment 5 or 6 wherein the second fluoropolymer layer is provided over the first fluoropolymer layer, the first fluorinated developing agent comprises the second hydrofluoroether thereby removing uncovered portions of the second fluoropolymer layer to form a pattern of uncovered first fluoropolymer layer, and further comprising contacting the uncovered first fluoropolymer layer with a second fluorinated developing agent comprising the first perfluorinated solvent or the first hydrofluoroether solvent to form the patterned resist structure and the complementary pattern of uncovered substrate corresponding to the second pattern.

9. The method according to embodiment 5 or 6 wherein the first fluoropolymer layer is provided over the second fluoropolymer layer, and prior to contacting with the first fluorinated developing agent, further comprising contacting at least a portion of the first fluoropolymer layer with a second fluorinated developing agent comprising the first perfluorinated solvent.

10. The method according to any of embodiments 5-9 wherein the third photopolymer layer further comprises a fluorinated surfactant.

11. The method according to any of embodiments 4-10 wherein the third photopolymer layer is a negative tone photoresist.

12. The method according to embodiment 4 wherein the first fluoropolymer layer is provided over the second fluoropolymer layer, and the third photopolymer layer is a photosensitive fluoropolymer provided from a composition comprising a hydrofluoroether coating solvent.

13. The method according to embodiment 12 wherein the photo-lithographically-forming step includes exposing the third photopolymer layer to patterned radiation to form an exposed photopolymer layer and contacting the exposed photopolymer layer with the first fluorinated developing agent to form a first pattern of photopolymer.

14. The method according to embodiment 13 wherein the first fluorinated developing agent comprises the first hydrofluoroether that further removes uncovered portions of the first and second fluoropolymer layers to form the patterned resist structure and the complementary pattern of uncovered substrate corresponding to the second pattern.

15. The method according to embodiment 1 wherein the second fluoropolymer layer is a fluorinated photopolymer layer provided over the first fluoropolymer layer from a composition comprising the second fluoropolymer material, which is a photosensitive fluoropolymer material, and a hydrofluoroether coating solvent.

16. The method according to embodiment 15 wherein the photo-lithographically-forming step includes exposing the fluorinated photopolymer layer to patterned radiation to form an exposed photopolymer layer and contacting the exposed photopolymer layer with the first fluorinated developing agent to form a first pattern of photopolymer.

17. The method according to embodiment 16 wherein the first fluorinated developing agent comprises the first hydrofluoroether that further removes uncovered portions of the first and fluoropolymer layer to form the patterned resist structure and the complementary pattern of uncovered substrate corresponding to the second pattern.

18. The method according to any of embodiments 1-17 wherein the first hydrofluoroether solvent is saturated having at least four more perfluorinated carbon atoms than hydrogen-containing carbon atoms.

19. The method according to any of embodiments 1-18 wherein the first hydrofluoroether solvent is a saturated segregated hydrofluoroether having at least five perfluorinated carbon atoms and less than three hydrogen-containing carbon atoms.

20. The method according to any of embodiments 1-19 wherein the second hydrofluoroether solvent is saturated having fewer than four more perfluorinated carbon atoms than hydrogen-containing atoms and has a fluorine content of at least 60% by weight.

21. The method according to any of embodiments 1-20 wherein the second hydrofluoroether solvent is a saturated segregated hydrofluoroether having less than five perfluorinated carbon atoms or is a non-segregated hydrofluoroalkylether.

22. The method according to any of embodiments 1-21 wherein the first perfluorinated solvent is an unsaturated perfluorocarbon, perfluoroether or perfluoroalkyl amine.

23. The method according to any of embodiments 1-22 wherein the first fluoropolymer material comprises a fluorinated cyclic structure.

24. The method according to any of embodiments 1-23 wherein the first fluoropolymer material comprises a perfluorinated cyclic ether or dioxol.

25. The method according to any of embodiments 1-24 wherein the second fluoropolymer material is not perfluorinated.

26. The method according to any of embodiments 1-25 wherein the second fluoropolymer material includes a repeating unit having a fully or partially fluorinated alkyl or alkyl ether group.

27. The method according to any of embodiments 1-26 wherein the second fluoropolymer material includes a copolymer comprising a first repeating unit having a fluorinated group and a second repeating unit having a non-fluorinated alkyl or alkyl ether group.

28. The method according to any of embodiments 1-27 wherein the second fluoropolymer material is formed from one or more monomers comprising an acrylate or an acrylate derivative.

29. The method according to any of embodiments 1-28 wherein the patterned resist structure has an undercut profile.

30. A method of patterning a device, comprising:
a) over a device substrate, forming a first fluoropolymer layer including a first fluoropolymer material having a fluorine content of at least 50% by weight and substantially soluble in a first hydrofluoroether solvent or in a first perfluorinated solvent, but substantially less soluble in a second hydrofluoroether solvent relative to both the first hydrofluoroether and the first perfluorinated solvent,
b) over the first fluoropolymer layer, forming a photopolymer layer from a composition comprising a second hydrofluoroether solvent and a photopolymer material having a fluorine content less than that of the first fluoropolymer material:

c) exposing the photopolymer layer to patterned radiation to form an exposed photopolymer layer having a pattern of exposed regions and a complementary pattern of unexposed regions;

d) contacting the exposed photopolymer layer with a photopolymer developing agent comprising either (i) a third hydrofluoroether solvent to remove unexposed areas or (ii) an aqueous alkaline solution to remove exposed areas, thereby forming uncovered areas of the first fluoropolymer in accordance with the patterned radiation; and e) contacting the uncovered areas of first fluoropolymer with a fluoropolymer developing agent comprising the first hydrofluoroether solvent or the first perfluorinated solvent to remove uncovered areas, thereby forming a patterned resist structure and a complementary pattern of uncovered substrate.

31. The method of embodiment 30 wherein the photopolymer includes at least a first repeating unit having an acid-catalyzed, solubility-altering reactive group, wherein the total fluorine content of the photopolymer is less than 30% by weight.

32. The method according to embodiment 30 or 31 wherein the first hydrofluoroether solvent is saturated having at least four more perfluorinated carbon atoms than hydrogen-containing carbon atoms.

33. The method according to any of embodiments 30-32 wherein the first hydrofluoroether solvent is a saturated segregated hydrofluoroether having at least five perfluorinated carbon atoms and less than three hydrogen-containing carbon atoms.

34. The method according to any of embodiments 30-33 wherein the second hydrofluoroether solvent is saturated having fewer than four more perfluorinated carbon atoms than hydrogen-containing atoms and has a fluorine content of at least 60% by weight.

35. The method according to any of embodiments 30-34 wherein the second hydrofluoroether solvent is a saturated segregated hydrofluoroether having less than five perfluorinated carbon atoms or is a non-segregated hydrofluoroalkylether.

36. A method of patterning a device, comprising:

a) over a device substrate, forming a patterned lift-off structure and a complementary pattern of uncovered substrate, the patterned lift-off structure having a bottom fluoropolymer layer, a middle fluoropolymer layer and a top photopolymer layer; and b) contacting the lift-off structure with a lift-off agent comprising a fluorinated solvent which dissolves the middle fluoropolymer layer thereby lifting-off the top photopolymer but does not fully dissolve the bottom fluoropolymer.

37. The method of embodiment 36 wherein the bottom fluoropolymer layer comprises a bottom fluoropolymer material comprising a perfluorinated cyclic ether or dioxol, the middle fluoropolymer layer comprises a middle fluoropolymer material that is not perfluorinated, and the fluorinated solvent is: (i) a saturated hydrofluoroether having fewer than four more perfluorinated carbon atoms than hydrogen-containing atoms and has a fluorine content of at least 60% by weight, or (ii) a saturated segregated hydrofluoroether having less than five perfluorinated carbon atoms or is a non-segregated hydrofluoroalkylether.

38. The method of embodiment 37 wherein the middle fluoropolymer material is a copolymer comprising at least two distinct repeating units including a first repeating unit having a fluorine-containing group and a second repeating unit having a non-photoactive functional group that does not include a protic substituent, wherein the copolymer has a total fluorine content of at least 45% by weight.

39. The method according to embodiment 38 wherein the functional group includes an aliphatic hydrocarbon that does not include a protic substituent.

40. The method according to embodiment 39 wherein the copolymer has a total fluorine content in a range of 46 to 53% by weight.

41. The method according to any of embodiments 36-40 wherein the top photopolymer layer includes a non-fluorinated photopolymer material.

42. The method according to embodiment 36 wherein the middle fluoropolymer layer comprises a middle fluoropolymer material comprising a perfluorinated cyclic ether or dioxol, the bottom fluoropolymer layer comprises a bottom fluoropolymer material that is not perfluorinated, and the fluorinated solvent is a perfluorinated solvent.

43. The method according to embodiment 42 wherein the photopolymer layer includes a fluorinated photopolymer material.

44. A photoresist system comprising:

a) a first fluoropolymer composition comprising a first fluoropolymer material having a fluorine content of at least 50% by weight and a first perfluorinated coating solvent or a first hydrofluoroether coating solvent that is saturated having at least four more perfluorinated carbon atoms than hydrogen-containing carbon atoms; and b) a second fluoropolymer composition comprising a second fluoropolymer material having a fluorine content less than that of the first fluoropolymer material and a second hydrofluoroether solvent that is saturated having fewer than four more perfluorinated carbon atoms than hydrogen-containing atoms and has a fluorine content of at least 60% by weight.

45. The system of embodiment 44 further including a photoresist composition comprising a photosensitive polymer and a non-fluorinated organic solvent.

46. The system of embodiment 44 wherein the second fluoropolymer material is photosensitive.

47. The system of embodiment 46 wherein the second fluoropolymer composition includes a photoacid generator compound.

48. The system according to any of embodiments 44-47 further comprising a developing agent comprising a hydrofluoroether developing solvent 49. The system according to any of embodiments 44-48 further comprising a lift-off agent comprising a hydrofluoroether lift-off solvent.

50. The system according to any of embodiments 48-49 further comprising a cleaning agent having a composition different from the developing agent or the lift-off agent, wherein the cleaning agent includes a third hydrofluoroether.

51. The system of embodiment 50 wherein the cleaning agent further includes a protic solvent.

52. A photoresist system comprising:

a) a first fluoropolymer composition comprising a first fluoropolymer material having a fluorine content of at least 50% by weight and a first perfluorinated coating solvent or a first hydrofluoroether coating solvent that is saturated having at least four more perfluorinated carbon atoms than hydrogen-containing carbon atoms; and b) a photopolymer composition comprising (i) a photopolymer including at least a first repeating unit having an acid-catalyzed, solubility-altering reactive group, wherein the total fluorine content of the photopolymer is less than 30% by weight, and (ii) a second hydrofluoroether solvent that is saturated having fewer than four more perfluorinated carbon atoms than hydrogen-containing atoms and has a fluorine content of at least 60% by weight.

53. The system of embodiment 52 wherein the photopolymer is non-fluorinated.

EXAMPLES

Example 1

In this example, the barrier properties of a first fluoropolymer layer to HFE-soluble PAG was tested. Over a silicon substrate, ~1 µm of a highly sensitive fluorinated photopolymer was coated and baked on a hot plate at 90° C. for 1 min. The photopolymer was a high contrast, acid-catalyzed type having carboxylic acid-forming precursor groups. When this photopolymer includes 1% by weight of CGI-1907 (a fluorinated, non-charged PAG), it has been found that just 2.7 mJ/cm$^2$ of exposure at 365 nm is required to make the film insoluble in a first-type of HFE developer. In this test, however, no PAG was added and this film has no light-sensitivity up to 250 mJ/cm$^2$.

Over the PAG-less fluorinated photopolymer, Cytop 809A (a first fluoropolymer layer) diluted in CTSolv-180 was spin coated and baked on a hot plate at 90° C. for 1 min. The Cytop was 2.6 µm thick. Over the Cytop was coated a second fluoropolymer layer including 1% by weight of PAG CGI-1907. The second fluoropolymer was provided by coating a composition including a second-type HFE solvent with about 12% by weight of a methacrylate-based fluoropolymer having fluorine-containing pendant alkyl groups and non-fluorine containing pendant alkyl groups. The fluorine content of the fluoropolymer was about 49% by weight. This second fluoropolymer, however, did not include switching groups and so it was not inherently photosensitive. Further, this fluoropolymer along with the PAG was substantially transparent at 365 nm. The second fluoropolymer was baked on a hot plate and had a thickness of about 3.8 µm. Thus, a substantial loading of PAG was provided over the first fluoropolymer layer.

Half of the silicon wafer was exposed to 365 nm radiation with a dose of ~250 mJ/cm$^2$. This was followed by a 1 min post exposure bake at 90° C. The wafer was first developed with two 10 sec "puddles" of a second type of HFE followed by spin dry to remove the top (second) fluoropolymer. The wafer was next developed with a first-type of HFE to develop the first fluoropolymer layer (Cytop) and underlying fluorinated photopolymer. Unexposed fluorinated photopolymer will readily dissolve, but as mentioned, exposed photopolymer in the presence of PAG will not above a dose of 2.7 mJ/cm$^2$. It was found that there was no difference between exposed and unexposed areas in that both areas fully developed at the same rate. Thus, the first fluoropolymer layer (Cytop) prevents substantial PAG or photogenerated acid from reaching the photosensitive underlying layer.

Example 2

General Structure I

A glass substrate was provided having a center portion that included a conductive ITO coating. A patterned dielectric was formed over a portion of center ITO from positive photoresist (AZ1512, diluted) by conventional methods and hard-baked at 150° C. for 5 minutes. The patterned dielectric was about 500 nm thick and had highly tapered features. The patterned dielectric had an array of rectangular openings, each 10 µm wide and 36 µm long, each separated by 4 µm in the horizontal direction and 6 µm in the vertical direction.

Over a glass substrate, a first fluoropolymer layer of 0.90 µm Cytop 109A was coated from a first-type HFE solvent. A second fluoropolymer layer which was photosensitive was spin coated over the Cytop to form a film 1.2 µm thick. In particular, the second fluoropolymer was a negative tone, branched photosensitive fluoropolymer similar to those described in U.S. application Ser. No. 14/539,574 and coated from HFE-7600, a second-type HFE solvent. The fluoropolymer included fluorine-containing alkyl groups, acid-catalyzed, carboxylic acid forming precursor groups, sensitizing dye units, acid quenching units and had a fluorine content of about 40% by weight. The coating composition further included a photoacid generating compound CGI-1907 at 1% by weight relative to the fluoropolymer. The photosensitive fluoropolymer has high solubility in HFE-7600. The authors have surprisingly found that Cytop has low solubility in HFE-7600 thereby enabling easy coating of the photosensitive fluoropolymer over Cytop. Other investigators have shown that coating of conventional photoresists is difficult over Cytop due to dewetting, but the authors have found that the photosensitive fluoropolymer from the second-type HFE coats very well and overcomes a significant problem. Further, the photosensitive fluoropolymer was surprisingly much less prone to dirt contamination relative to conventional photoresists such as nLOF resulting in fewer defects.

In alignment with the underlying dielectric, the photosensitive fluoropolymer was exposed through a mask at 14 mJ/cm$^2$ (post apply and post exposure bakes done for 1 min at 90° C.) and was developed with a few second puddle of HFE-7100 which rapidly dissolves unexposed areas but not underlying Cytop to form a sharp pattern of rectangular openings over target openings in the patterned dielectric (every third column of openings). The underlying Cytop was developed using a first-type HFE, in this case HFE-7300 to form a lift-off structure that was successfully used to pattern OLED devices at high resolution. After deposition of OLED materials, the structure was immersed in warm HFE-7300 (between 50° C. and 60° C.) for lift-off. Lift off of the pixel patterned area occurred in less than 1 minute without agitation.

Example 3

General Structure IA

Over a silicon wafer Cytop 809A in CTSolv-180 (a perfluoroalkylamine solvent) was spin coated at 2000 rpm to form a first fluoropolymer layer having a thickness of 0.5 µm. Over the first fluoropolymer layer, a 1.2 µm layer of a photopolymer (poly-TBMA with 3% PAG by weight relative to the polymer) was formed by spin coating the poly-TBMA from an HFE-7600 solution (a second-type HFE). Each layer received a 1 min, 90° C. post-apply bake. The bilayer was exposed to about 180 mJ/cm$^2$ of 360 nm radiation through a chrome mask having 50 µm lines and spaces. The exposed film received a 1 min, 90° C. post-exposure bake to cause formation of carboxylic acid groups in the exposed areas. The photopolymer layer was developed using HFE-7600 for 2.5 min to form a pattern of lines and spaces over the Cytop. Next, the Cytop was developed by contact with 30 sec of HFE-7300 (a first-type HFE). This formed a pattern of bilayer lift-off structure lines and uncovered Si wafer spaces corresponding to the mask exposure. The lift-off structure had a visible undercut of a few microns which could be increased by additional development. The structure readily lifts off in warm HFE-7300.

Example 4

General Structure III

Over a silicon wafer Cytop 809A in CTSolv-180 (a perfluoroalkylamine solvent) was spin coated at 2000 rpm to form a first fluoropolymer layer having a thickness of 0.5 µm. Over the first fluoropolymer layer, a 2.4 µm layer of a second fluoropolymer was formed by spin coating a second fluoropolymer material from a second-type HFE. The second fluoropolymer was a non-photosensitive methacrylate-based fluoropolymer having fluorine-containing pendant alkyl groups and non-fluorine containing pendant alkyl groups. The fluorine content of the fluoropolymer was about 51% by weight. Over the second fluoropolymer, 1.7 µm of nLOF 2020 (a negative photoresist in a PGMEA coating solvent) was spin coated. The nLOF had acceptable wetting over the second fluoropolymer and better than if it had been applied on the Cytop directly. Each film coating received a post-apply bake. Other testing by the authors has shown that PGMEA can penetrate the second fluoropolymer layer to some degree, but the first fluoropolymer layer is much more resistant to PGMEA. The film was exposed through a mask having 50 µm lines and spaces and the nLOF layer was developed with a TMAH developer. This was followed by development with a first-type HFE solvent that removed the second fluoropolymer layer and the first fluoropolymer layer in 50 µm line regions where the nLOF lines were removed. The fluoropolymer layers were undercut 1.5 µm relative to the nLOF.

Silver metal was deposited on the lift-off structure and then immersed in a second-type HFE for lift-off. The lift-off of the nLOF/silver readily occurred leaving lines of silver metal on the substrate and Cytop in between. The patterned Cytop could be later removed if so desired with a first-type HFE or a perfluorinated solvent.

Example 5

General Structure III

This was similar to Example 3 except the lift-off agent included a first-type HFE solvent heated to between 50° C. and 60° C. and both of the fluoropolymers were removed in the lift-off of the nLOF layer.

The above invention has been described in detail with particular reference to certain embodiments thereof, but it will be understood that variations, combinations, and modifications can be effected by a person of ordinary skill in the art within the spirit and scope of the invention.

LIST OF REFERENCE NUMBERS USED IN THE DRAWINGS 111 device substrate
112 resist precursor structure
113 first fluoropolymer layer
115 photosensitive second fluoropolymer layer
119 radiation source
121 photomask
123 exposed second fluoropolymer layer
125 pattern of exposed regions
127 pattern of unexposed regions
128 patterned resist precursor structure
131 pattern of uncovered fluoropolymer
133 patterned resist structure
135 pattern of openings
137 undercut region
139 pattern of uncovered substrate
146 device material layer
146' device material layer
150 intermediate device structure
160 patterned device structure
211 device substrate
212 resist precursor structure
213 first fluoropolymer layer
214 second fluoropolymer layer
217 photopolymer layer
220 patterned first fluoropolymer layer
223 exposed photopolymer layer
225 pattern of exposed regions
227 pattern of unexposed regions
228 patterned resist precursor structure
228' second patterned resist precursor structure
231 pattern of uncovered fluoropolymer
233 patterned resist structure
235 pattern of openings
237 undercut region
239 pattern of uncovered substrate
311 device substrate
312 resist precursor structure
313 first fluoropolymer layer
314 second fluoropolymer layer
317 photopolymer layer
320 patterned second fluoropolymer layer
323 exposed photopolymer layer
325 pattern of exposed regions
327 pattern of unexposed regions
328 patterned resist precursor structure
328' second patterned resist precursor structure
331 pattern of uncovered fluoropolymer
333 patterned resist structure
335 pattern of openings
337 undercut region
339 pattern of uncovered substrate

The invention claimed is:

1. A method of patterning a device, comprising:
   a) over a device substrate, forming a resist precursor structure including
      i) a first fluoropolymer layer including a first fluoropolymer material having a fluorine content of at least 50% by weight and substantially soluble in a first hydrofluoroether solvent or in a first perfluorinated solvent, but substantially less soluble in a second hydrofluoroether solvent relative to both the first hydrofluoroether and the first perfluorinated solvent, and
      ii) a second fluoropolymer layer including a second fluoropolymer material having a fluorine content less than that of the first fluoropolymer material and substantially soluble in the first or second hydrofluoroether solvents, but substantially less soluble in the first perfluorinated solvent relative to both the first and second hydrofluoroether solvents; and
   b) photo-lithographically forming a patterned resist structure and a complementary pattern of uncovered substrate, wherein such forming includes contact of at least a portion of the second fluoropolymer layer with a first fluorinated developing agent comprising the first or second hydrofluoroether solvent.

2. The method of claim 1 further including treating the device substrate to form an intermediate patterned device structure, wherein the patterned resist structure acts as mask.

3. The method of claim 1 further including removing a top layer of the patterned resist structure by contact with a lift-off agent comprising a third hydrofluoroether solvent that is optionally the same as the first hydrofluoroether solvent or the second hydrofluoroether solvent, or a second perfluorinated solvent that is optionally the same as first perfluorinated solvent.

4. The method of claim 1 wherein the resist precursor structure further comprises a third photopolymer layer provided over the first and second fluoropolymer layers.

5. The method of claim 4 wherein the third photopolymer layer is provided from a photosensitive polymer material composition comprising at least 50% by weight of one or more non-fluorinated coating solvents.

6. The method of claim 5 wherein the photo-lithographically forming step includes exposing the third photopolymer layer to patterned radiation to form an exposed photopolymer layer and contacting the exposed photopolymer layer with an aqueous or non-fluorinated organic developing agent to form a first pattern of photopolymer and a complementary second pattern of uncovered fluoropolymer.

7. The method of claim 6 wherein the first fluorinated developing agent comprises the first hydrofluoroether thereby removing uncovered portions of the first and second fluoropolymer layers to form the patterned resist structure and the complementary pattern of uncovered substrate corresponding to the second pattern.

8. The method of claim 6 wherein the second fluoropolymer layer is provided over the first fluoropolymer layer, and wherein the first fluorinated developing agent comprises the second hydrofluoroether which removes uncovered portions of the second fluoropolymer layer to form a pattern of uncovered first fluoropolymer layer.

9. The method of claim 8 further comprising contacting the uncovered first fluoropolymer layer with a second fluorinated developing agent comprising the first perfluorinated solvent or the first hydrofluoroether solvent to form the patterned resist structure and the complementary pattern of uncovered substrate corresponding to the second pattern.

10. The method of claim 6 wherein the first fluoropolymer layer is provided over the second fluoropolymer layer, and prior to contacting with the first fluorinated developing agent, further comprising contacting at least a portion of the first fluoropolymer layer with a second fluorinated developing agent comprising the first perfluorinated solvent.

11. The method of claim 5 wherein the third photopolymer layer further comprises a fluorinated surfactant.

12. The method of claim 4 wherein the third photopolymer layer is a negative tone photoresist.

13. The method of claim 4 wherein the first fluoropolymer layer is provided over the second fluoropolymer layer, and the third photopolymer layer is a photosensitive fluoropolymer provided from a composition comprising a hydrofluoroether coating solvent.

14. The method of claim 13 wherein the photo-lithographically-forming step includes exposing the third photopolymer layer to patterned radiation to form an exposed photopolymer layer and contacting the exposed photopolymer layer with the first fluorinated developing agent to form a first pattern of photopolymer.

15. The method of claim 14 wherein the first fluorinated developing agent comprises the first hydrofluoroether that further removes uncovered portions of the first and second fluoropolymer layers to form the patterned resist structure and the complementary pattern of uncovered substrate corresponding to the second pattern.

16. The method of claim 1 wherein the second fluoropolymer layer is a fluorinated photopolymer layer provided over the first fluoropolymer layer from a composition comprising the second fluoropolymer material, which is a photosensitive fluoropolymer material, and a hydrofluoroether coating solvent.

17. The method of claim 16 wherein the photo-lithographically-forming step includes exposing the fluorinated photopolymer layer to patterned radiation to form an exposed photopolymer layer and contacting the exposed photopolymer layer with the first fluorinated developing agent to form a first pattern of photopolymer.

18. The method of claim 17 wherein the first fluorinated developing agent comprises the first hydrofluoroether that further removes uncovered portions of the first and fluoropolymer layer to form the patterned resist structure and the complementary pattern of uncovered substrate corresponding to the second pattern.

19. The method of claim 1 wherein the first hydrofluoroether solvent is saturated having at least four more perfluorinated carbon atoms than hydrogen-containing carbon atoms.

20. The method of claim 1 wherein the first hydrofluoroether solvent is a saturated segregated hydrofluoroether having at least five perfluorinated carbon atoms and less than three hydrogen-containing carbon atoms.

21. The method of claim 1 wherein the second hydrofluoroether solvent is saturated having fewer than four more perfluorinated carbon atoms than hydrogen-containing atoms and has a fluorine content of at least 60% by weight.

22. The method of claim 1 wherein the second hydrofluoroether solvent is a saturated segregated hydrofluoroether having less than five perfluorinated carbon atoms or is a non-segregated hydrofluoroalkylether.

23. The method of claim 1 wherein the first perfluorinated solvent is an unsaturated perfluorocarbon, perfluoroether or perfluoroalkyl amine.

24. The method of claim 1 wherein the first fluoropolymer material comprises a fluorinated cyclic structure.

25. The method of claim 1 wherein the first fluoropolymer material comprises a perfluorinated cyclic ether or dioxol.

26. The method of claim 1 wherein the second fluoropolymer material is not perfluorinated.

27. The method of claim 1 wherein the second fluoropolymer material includes a repeating unit having a fully or partially fluorinated alkyl or alkyl ether group.

28. The method of claim 1 wherein the second fluoropolymer material includes a copolymer comprising a first repeating unit having a fluorinated group and a second repeating unit having a non-fluorinated alkyl or alkyl ether group.

29. The method of claim 1 wherein the second fluoropolymer material is formed from one or more monomers comprising an acrylate or an acrylate derivative.

30. The method of claim 1 wherein the patterned resist structure has an undercut profile.

* * * * *